US012588553B2

(12) United States Patent
Lo

(10) Patent No.: US 12,588,553 B2
(45) Date of Patent: Mar. 24, 2026

(54) SEMICONDUCTOR STRUCTURE HAVING CONDUCTIVE PAD WITH PROTRUSION AND MANUFACTURING METHOD THEREOF

(71) Applicant: NANYA TECHNOLOGY CORPORATION, New Taipei City (TW)

(72) Inventor: Yi-Jen Lo, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 676 days.

(21) Appl. No.: 17/889,485

(22) Filed: Aug. 17, 2022

(65) Prior Publication Data

US 2024/0063151 A1     Feb. 22, 2024

(51) Int. Cl.
*H01L 23/00* (2006.01)
*H01L 25/065* (2023.01)

(52) U.S. Cl.
CPC .............. *H01L 24/05* (2013.01); *H01L 24/08* (2013.01); *H01L 24/80* (2013.01); (Continued)

(58) Field of Classification Search
CPC ......... H01L 24/05; H01L 24/08; H01L 24/80; H01L 25/0657; H01L 2224/05009; (Continued)

(56) References Cited

U.S. PATENT DOCUMENTS

| | | | |
|---|---|---|---|
| 11,011,494 B2 | 5/2021 | Gao et al. | |
| 11,049,791 B1 | 6/2021 | Liff et al. | |

(Continued)

FOREIGN PATENT DOCUMENTS

| | | |
|---|---|---|
| TW | 201919193 A | 5/2019 |
| TW | 202109793 A | 3/2021 |

(Continued)

OTHER PUBLICATIONS

Y. Kagawa et al., "Impacts of Misalignment on 1μm Pitch Cu—Cu Hybrid Bonding," 2020 IEEE International Interconnect Technology Conference (IITC), 2020, pp. 148-150.
(Continued)

*Primary Examiner* — Raj R Gupta
(74) *Attorney, Agent, or Firm* — MUNCY, GEISSLER, OLDS & LOWE, P.C.

(57)     ABSTRACT

The present application provides a semiconductor structure having a conductive pad with a protrusion, and a manufacturing method of the semiconductor structure. The semiconductor structure includes a first die including a first substrate, a first dielectric layer over the first substrate, a first conductive pad at least partially exposed through the first dielectric layer, a first bonding layer over the first dielectric layer, and a first via extending through the first bonding layer and coupled to the first conductive pad; and a second die including a second bonding layer bonded to the first bonding layer, a second substrate over the second bonding layer, and a second via extending through the second substrate and the second bonding layer, wherein a first contact surface area between the first bonding layer and the second via is substantially greater than a second contact surface area between the first via and the second via.

12 Claims, 36 Drawing Sheets

(52) U.S. Cl.
CPC ................................ *H01L 25/0657* (2013.01);
*H01L 2224/05009* (2013.01); *H01L
2224/05014* (2013.01); *H01L 2224/05015*
(2013.01); *H01L 2224/05017* (2013.01); *H01L
2224/05083* (2013.01); *H01L 2224/05541*
(2013.01); *H01L 2224/05554* (2013.01); *H01L
2224/05555* (2013.01); *H01L 2224/05556*
(2013.01); *H01L 2224/05576* (2013.01); *H01L
2224/08146* (2013.01); *H01L 2224/80895*
(2013.01); *H01L 2224/80896* (2013.01); *H01L
2225/06524* (2013.01); *H01L 2225/06527*
(2013.01); *H01L 2225/06544* (2013.01); *H01L
2924/30101* (2013.01)

(58) Field of Classification Search
CPC . H01L 2224/05014; H01L 2224/05015; H01L
2224/05017; H01L 2224/05083; H01L
2224/05541; H01L 2224/05554; H01L
2224/05555; H01L 2224/05556; H01L
2224/05576; H01L 2224/08146; H01L
2224/80895; H01L 2224/80896; H01L
2225/06524; H01L 2225/06527; H01L
2225/06544; H01L 2924/30101; H01L
23/291; H01L 23/3171; H01L
2221/68327; H01L 2221/68345; H01L
21/6835; H01L 2225/06565; H01L
2225/1058; H01L 24/13; H01L
2225/06541; H01L 25/105; H01L 25/50;

H01L 23/481; H01L 21/76898; H01L
23/5226; H01L 23/5283
See application file for complete search history.

(56) References Cited

U.S. PATENT DOCUMENTS

| | | | | |
|---|---|---|---|---|
| 2015/0130049 | A1* | 5/2015 | Chen | H01L 23/528 |
| | | | | 257/737 |
| 2016/0351463 | A1* | 12/2016 | Chen | H01L 21/56 |
| 2017/0207169 | A1 | 7/2017 | Lee | |
| 2018/0012862 | A1 | 1/2018 | Yu et al. | |
| 2018/0350745 | A1* | 12/2018 | Hsieh | H01L 23/5384 |
| 2020/0006141 | A1* | 1/2020 | Wang | H01L 24/09 |
| 2020/0091063 | A1* | 3/2020 | Chen | H01L 21/6835 |
| 2021/0066252 | A1* | 3/2021 | Chen | H01L 24/13 |

FOREIGN PATENT DOCUMENTS

| | | |
|---|---|---|
| TW | 202113998 A | 4/2021 |
| TW | 202117868 A | 5/2021 |
| TW | 202203377 A | 1/2022 |
| TW | 202218080 A | 5/2022 |

OTHER PUBLICATIONS

G. Gao et al., "Low Temperature Hybrid Bonding for Die to Wafer Stacking Applications," 2021 IEEE 71st Electronic Components and Technology Conference (ECTC), 2021, pp. 383-389.

* cited by examiner

A1

A2

101i/102i

101g/102g

101i/102i

101g/102g

101i/102i

101g/102g

SEMICONDUCTOR STRUCTURE HAVING CONDUCTIVE PAD WITH PROTRUSION AND MANUFACTURING METHOD THEREOF

TECHNICAL FIELD

The present disclosure relates to a semiconductor structure, and a method of manufacturing the semiconductor structure. Particularly, the present disclosure relates to a semiconductor structure having a conductive pad with a protrusion protruding from the conductive pad, and a method of manufacturing the semiconductor structure including forming the protrusion on the conductive pad.

DISCUSSION OF THE BACKGROUND

Semiconductor devices are used in a variety of electronic applications, such as personal computers, cellular telephones, digital cameras, and other electronic equipment. Fabrication of semiconductor devices involves sequentially depositing various material layers over a semiconductor wafer, and patterning the material layers using lithography and etching processes to form microelectronic components, including transistors, diodes, resistors and/or capacitors, on or in the semiconductor wafer.

The semiconductor industry continues to improve integration density of the microelectronic components by continual reduction of minimum feature size, which allows more components to be integrated into a given area. Smaller package structures with smaller footprints are developed to package the semiconductor devices, in order to facilitate formation and integration of components of different sizes. However, such formation and integration may increase complexity of manufacturing processes. It is therefore desirable to develop improvements that address the aforementioned challenges.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor structure. The semiconductor structure includes a first die including a first substrate, a first dielectric layer over the first substrate, a first conductive pad at least partially exposed through the first dielectric layer, a first bonding layer over the first dielectric layer, and a first via extending through the first bonding layer and coupled to the first conductive pad; and a second die including a second bonding layer bonded to the first bonding layer, a second substrate over the second bonding layer, and a second via extending through the second substrate and the second bonding layer, wherein a first contact surface area between the first bonding layer and the second via is substantially greater than a second contact surface area between the first via and the second via.

In some embodiments, the first via is disposed between the second via and the first conductive pad.

In some embodiments, the second via is in contact with the first bonding layer.

In some embodiments, at least a portion of the first bonding layer is disposed between the first conductive pad and the second via.

In some embodiments, the second contact surface area has a circular, quadrilateral or polygonal shape.

In some embodiments, a first width of the first via is substantially less than a second width of the second via.

In some embodiments, the first width of the first via is substantially less than 2 μm.

In some embodiments, the second width of the second via is about 5 μm.

In some embodiments, a width of the first conductive pad is substantially greater than the first width of the first via and the second width of the second via.

In some embodiments, the semiconductor structure further comprises a first interconnect structure disposed within the first dielectric layer and under the first conductive pad; a second dielectric layer disposed over the second substrate; and a second conductive pad disposed over the second via and at least partially exposed through the second dielectric layer.

In some embodiments, the second via is electrically connected to the second conductive pad through a second interconnect structure.

In some embodiments, the first interconnect structure is coupled to the first conductive pad and electrically connected to the first via.

Another aspect of the present disclosure provides a semiconductor structure. The semiconductor structure includes a first die including a first substrate, a first dielectric layer over the first substrate, a first conductive pad at least partially exposed through the first dielectric layer, a first bonding layer over the first dielectric layer, and a plurality of first vias extending through the first bonding layer and coupled to the first conductive pad; and a second die including a second bonding layer bonded to the first bonding layer, a second substrate over the second bonding layer, and a second via extending through the second substrate and the second bonding layer, wherein a first width of each of the plurality of first vias is substantially less than a second width of the second via.

In some embodiments, a contact surface area between the first bonding layer and the second via is substantially greater than or equal to a total of contact surface areas between the plurality of first vias and the second via.

In some embodiments, at least a portion of the first bonding layer is between two adjacent first vias.

In some embodiments, the plurality of first vias extend between the first conductive pad and the second via.

In some embodiments, a cross-section of each of the plurality of first vias has a circular, quadrilateral or polygonal shape.

In some embodiments, the plurality of first vias are arranged in a matrix.

In some embodiments, a number of the plurality of first vias is two.

In some embodiments, the semiconductor structure further comprises a molding surrounding the first die and the second die.

Another aspect of the present disclosure provides a method of manufacturing a semiconductor structure. The method includes steps of forming a first die, forming a second die, and bonding the second die over the first die. The formation of the first die includes providing a first substrate and a first dielectric layer over the first substrate; forming a first conductive pad at least partially exposed through the first dielectric layer; disposing a first bonding layer over the first dielectric layer; removing a portion of the first bonding layer to form a first opening; and disposing a conductive material into the first opening to form a first via. The formation of the second die includes providing a second substrate, a second bonding layer over the second substrate, and a second via extending through the second substrate and partially through the second bonding layer; and removing a portion of the second bonding layer to expose the second via.

In some embodiments, the bonding of the second die over the first die includes bonding the second via to the first via.

In some embodiments, the bonding of the second die over the first die includes bonding the first bonding layer to the second bonding layer.

In some embodiments, the second die is flipped after the formation of the second die and prior to the bonding of the second die over the first die.

In some embodiments, the bonding of the second die over the first die is a hybrid bonding.

In some embodiments, a portion of the second via is bonded to the first bonding layer.

In some embodiments, the conductive material disposed over the first bonding layer is removed to expose the first via through the first bonding layer.

In some embodiments, the conductive material is disposed by chemical vapor deposition (CVD), physical vapor deposition (PVD) or sputtering.

In some embodiments, a width of the first opening is substantially less than 2 μm.

In some embodiments, the first opening has a circular, quadrilateral or polygonal shape.

In some embodiments, at least a portion of the first conductive pad is exposed through the first bonding layer after the formation of the first opening.

In some embodiments, the formation of the first die is performed prior to the formation of the second die.

In some embodiments, the formation of the first die and the formation of the second die are performed separately.

In some embodiments, the first via and the second via include a same material.

In some embodiments, the method further comprises forming a molding to surround the first die and the second die.

In conclusion, a first die is bonded to a second die by hybrid bonding, and the first die is electrically connected to the second die through a conductive pad in the first die, a through silicon via (TSV) in the second die, and a protrusion between the conductive pad and the TSV. Because the protrusion is substantially smaller than the conductive pad and the TSV, the protrusion can be formed by deposition rather than an electroplating process. Since the deposition can form the protrusion with a smaller grain size, the hybrid bonding between the first die and the second die can be annealed at a relatively lower temperature. Further, the relatively small protrusion does not significantly increase an electrical resistance between the conductive pad and the TSV. Therefore, formation of the protrusion between the conductive pad and the TSV is advantageous compared to a direct contact between the conductive pad and the TSV. As a result, the formation of the protrusion can improve an overall structure and reliability of the semiconductor structure.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
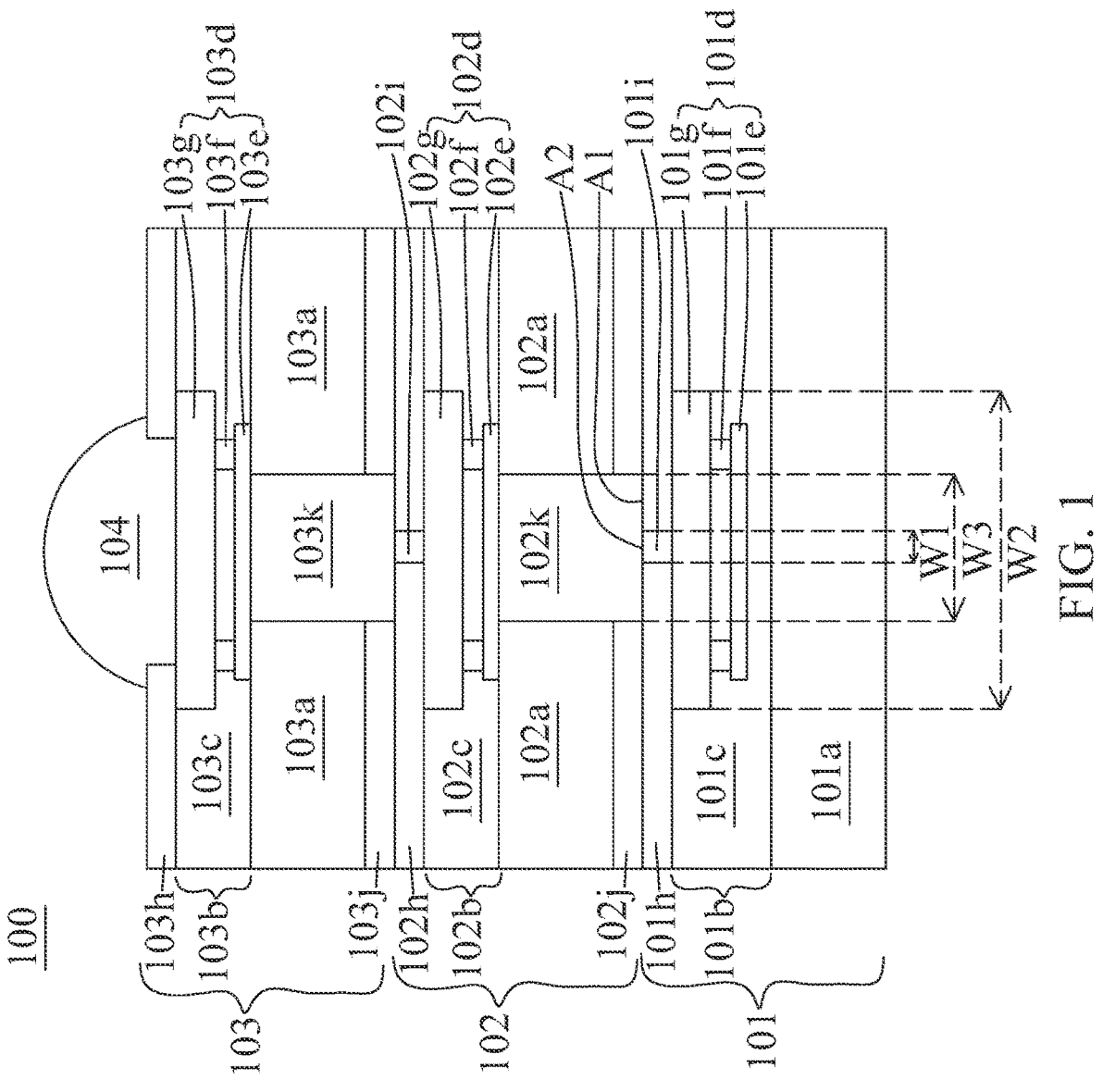
FIG. 1 is a cross-sectional view of a first semiconductor structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a schematic cross-sectional view of a first semiconductor structure 100 in accordance with some embodiments of the present disclosure. In some embodiments, the first semiconductor structure 100 is a part of a die, a package or a device. In some embodiments, the first semiconductor structure 100 is a die, a package or a device. In some embodiments, the first semiconductor structure 100 is a bonded structure.

In some embodiments, the first semiconductor structure 100 includes a first die 101 and a second die 102 stacked over the first die 101. In some embodiments, the first die 101 and the second die 102 comprise any of various known types of semiconductor devices such as accelerated processing unit (APU), memories, dynamic random-access memory (DRAM), NAND flash memory, central processing unit (CPU), graphic processing unit (GPU), microprocessors, application-specific integrated circuits (ASICs), digital signal processors (DSPs), or the like. In some embodiments, the first die 101 and the second die 102 are DRAM dies.

In some embodiments, the first die 101 includes a first substrate 101a, a first interconnect layer 101b over the first substrate 101a, and a first bonding layer 101h over the first interconnect layer 101b. In some embodiments, the first substrate 101a is a semiconductive layer. In some embodiments, the first substrate 101a includes semiconductive material such as silicon, germanium, gallium, arsenic, or a combination thereof. In some embodiments, the first substrate 101a is a silicon substrate.

In some embodiments, electrical devices or components (e.g., various N-type metal-oxide semiconductor (NMOS) and/or P-type metal-oxide semiconductor (PMOS) devices, capacitors, resistors, diodes, photodiodes, fuses, and/or the like) are subsequently formed in or over the first substrate 101a and configured to electrically connect to an external circuitry.

In some embodiments, the first interconnect layer 101b is disposed over a front side of the first substrate 101a. In some embodiments, the first interconnect layer 101b includes a first dielectric layer 101c and a first interconnect structure 101d surrounded by the first dielectric layer 101c. In some embodiments, the first dielectric layer 101c is disposed above the first substrate 101a. In some embodiments, the first dielectric layer 101c includes dielectric material such as oxide, nitride, silicon dioxide, silicon nitride, silicon oxynitride, silicon carbide, polymer or the like. In some embodiments, the first dielectric layer 101c includes several dielectric layers stacked over each other. In some embodiments, each of the dielectric layers includes materials that are same as or different from materials in others of the dielectric layers.

In some embodiments, the first interconnect structure 101d includes a first pad portion 101e, a first via portion 101f and a first conductive pad 101g. In some embodiments, the first pad portion 101e and the first via portion 101f are embedded in the first dielectric layer 101c. In some embodiments, the first pad portion 101e extends laterally within the first dielectric layer 101c, and the first via portion 101f extends vertically within the first dielectric layer 101c. In some embodiments, the first via portion 101f is electrically coupled to the first pad portion 101e. In some embodiments, the first pad portion 101e and the first via portion 101f include conductive material such as gold, silver, copper, nickel, tungsten, aluminum, tin, alloys thereof, or the like.

In some embodiments, the first conductive pad 101g is disposed above the first pad portion 101e and the first via portion 101f. In some embodiments, the first conductive pad 101g is surrounded by the first dielectric layer 101c and is at least partially exposed through the first dielectric layer 101c. In some embodiments, the first conductive pad 11g is electrically connected to the first pad portion 101e through the first via portion 101f. In some embodiments, the first conductive pad 101g is in contact with the first via portion 101f. In some embodiments, the first conductive pad 101g includes conductive material such as gold, silver, copper, nickel, tungsten, aluminum, tin, alloys thereof, or the like. In some embodiments, a top surface of the first conductive pad 101g has a circular, quadrilateral or polygonal shape.

In some embodiments, the first bonding layer 101h is disposed over the first interconnect layer 101b and the first substrate 101a. In some embodiments, the first bonding layer 101h includes dielectric material such as oxide, nitride, silicon dioxide, silicon nitride, silicon oxynitride, silicon carbide, polymer or the like. In some embodiments, the first bonding layer 101h is configured to form a bond with another bonding layer. In some embodiments, a top surface of the first conductive pad 101g is exposed and is in contact with the first bonding layer 101h. In some embodiments, the first conductive pad 101g is partially covered by the first bonding layer 101h.

In some embodiments, a first via 101i is surrounded by the first bonding layer 101h. In some embodiments, the first via 101i extends through the first bonding layer 101h and is in contact with the first conductive pad 101g. In some embodiments, the first via 101i protrudes from the first conductive pad 101g. In some embodiments, the first via 101i includes conductive material such as gold, silver, copper, nickel, tungsten, aluminum, tin, alloys thereof, or the like. In some embodiments, the first via 101i extends in a direction orthogonal to the first conductive pad 101g.

Figure 6:
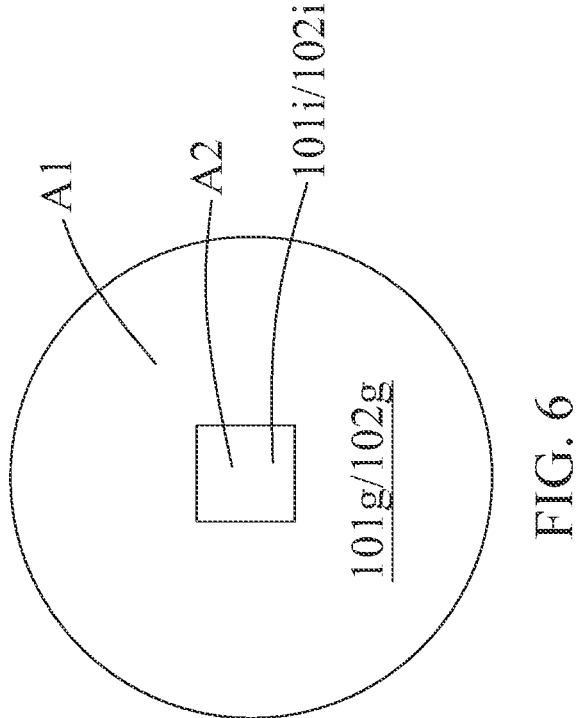
FIGS. 6 to 10 are cross-sectional views of various embodiments of a conductive pad and a first via in accordance with some embodiments of the present disclosure.
Figure 7:
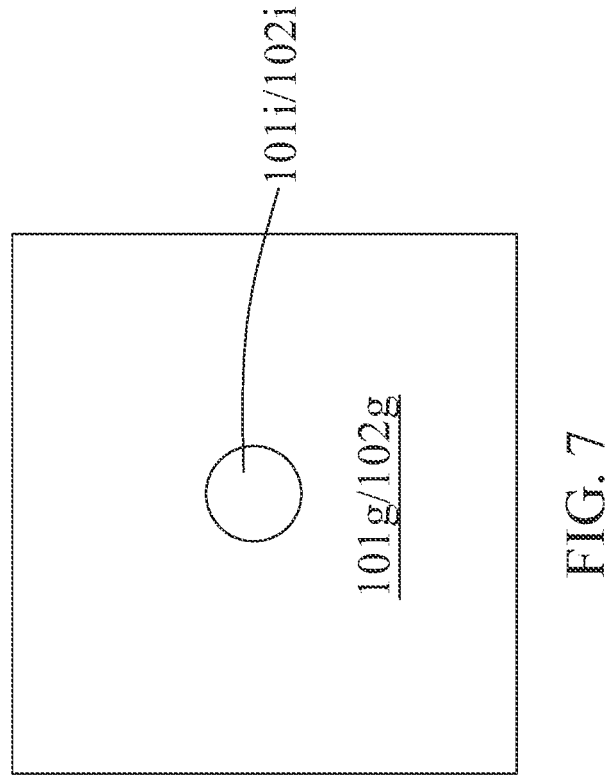
Figure 8:
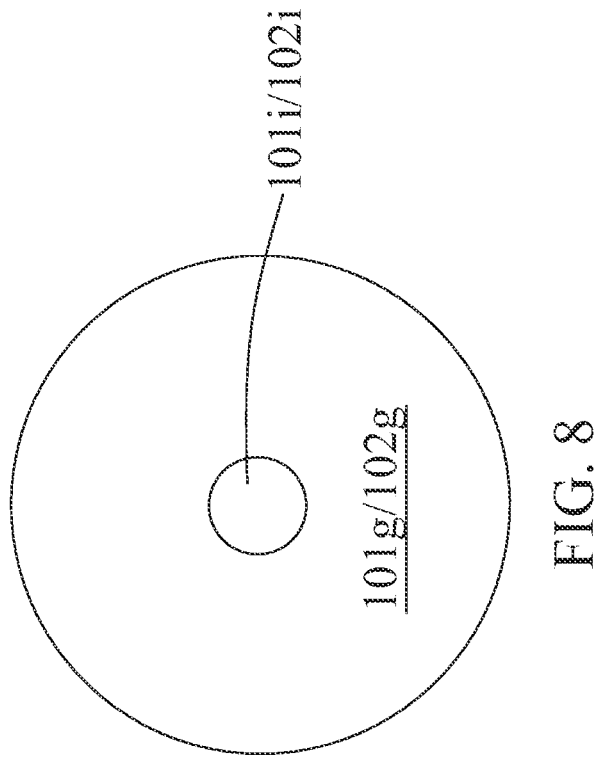

In some embodiments, a cross section of the first via 101i has a circular, quadrilateral or polygonal shape. FIGS. 6 to 8 show the first conductive pad 101g and the first via 101i in various shapes. As shown in FIGS. 6 and 7, a cross section of the first conductive pad 101g and a cross section of the first via 101i have different shapes. As shown in FIG. 8, the cross section of the first conductive pad 101g and the cross section of the first via 101i have a same shape.

Referring back to FIG. 1, the second die 102 is disposed above the first die 102. In some embodiments, the second die 102 includes a second substrate 102a, a second interconnect layer 102b over the second substrate 102a, a second bonding layer 102h over the second interconnect layer 102b, a third bonding layer 102j under the second substrate 102a, and a third via 102k extending through the second substrate 102a and the third bonding layer 102j. In some embodiments, the second substrate 102a is a semiconductive layer. In some embodiments, the second substrate 102a includes semiconductive material such as silicon, germanium, gallium, arsenic, or a combination thereof. In some embodiments, the second substrate 102a is a silicon substrate.

In some embodiments, the third bonding layer 102*j* is bonded to the first bonding layer 101*h*. In some embodiments, the third bonding layer 102*j* includes dielectric material such as oxide, nitride, silicon dioxide, silicon nitride, silicon oxynitride, silicon carbide, polymer or the like. In some embodiments, the second die 102 is bonded to the first die 101 by bonding the first bonding layer 101*h* to the third bonding layer 102*j*.

In some embodiments, the third via 102*k* is at least partially surrounded by the third bonding layer 102*j*. In some embodiments, the third via 102*k* is at least partially exposed to contact the first via 101*i*. In some embodiments, the third via 102*k* is at least partially in contact with the first bonding layer 101*h*. In some embodiments, at least a portion of the first bonding layer 101*h* is disposed between the first conductive pad 101*g* and the third via 102*k*. In some embodiments, the third via 102*k* is electrically connected to the second conductive pad 102*g* through the second interconnect structure 102*d*. In some embodiments, the first via 101*i* is disposed between the third via 102*k* and the first conductive pad 101*g*.

In some embodiments, the third via 102*k* is a through substrate via (TSV). In some embodiments, the third via 102*k* includes conductive material such as gold, silver, copper, nickel, tungsten, aluminum, tin, alloys thereof or the like. In some embodiments, a cross section of the third via 102*k* has a circular, quadrilateral or polygonal shape. In some embodiments, the third via 102*k* has a cylindrical shape.

In some embodiments, a first contact surface area A1 between the first bonding layer 101*h* and the third via 102*k* is substantially greater than a second contact surface area A2 between the first via 101*i* and the third via 102*k*. In some embodiments, the second contact surface area A2 has a circular, quadrilateral or polygonal shape. In some embodiments, a first width W1 of the first via 101*i* is substantially less than a third width W3 of the third via 102*k*. In some embodiments, the first width W1 of the first via 101*i* is substantially less than 2 μm. In some embodiments, the third width W3 of the third via 102*k* is about 5 μm. In some embodiments, a second width W2 of the first conductive pad 101*g* is substantially greater than the first width W1 of the first via 101*i* and the third width W3 of the third via 102*k*.

In some embodiments, the second interconnect layer 102*b* includes a second dielectric layer 102*c* and a second interconnect structure 102*d* surrounded by the second dielectric layer 102*c*. In some embodiments, the second dielectric layer 102*c* is disposed above the second substrate 102*a*. In some embodiments, the second dielectric layer 102*c* includes dielectric material such as oxide, nitride, silicon dioxide, silicon nitride, silicon oxynitride, silicon carbide, polymer or the like. In some embodiments, the second dielectric layer 102*c* includes several dielectric layers stacked over each other. In some embodiments, each of the dielectric layers includes materials that are same as or different from materials in others of the dielectric layers.

In some embodiments, the second interconnect structure 102*d* includes a second pad portion 102*e*, a second via portion 102*f* and a second conductive pad 102*g*. In some embodiments, the second pad portion 102*e* and the second via portion 102*f* are embedded in the second dielectric layer 102*c*. In some embodiments, the second pad portion 102*e* extends laterally within the second dielectric layer 102*c*, and the second via portion 102*f* extends vertically within the second dielectric layer 102*c*. In some embodiments, the second via portion 102*f* is electrically coupled to the second pad portion 102*e*. In some embodiments, the pad portion 102*e* is at least partially exposed through the second dielectric layer 102*c*. In some embodiments, the second pad portion 102*e* and the second via portion 102*f* include conductive material such as gold, silver, copper, nickel, tungsten, aluminum, tin, alloys thereof, or the like.

In some embodiments, the second conductive pad 102*g* is disposed above the second pad portion 102*e* and the second via portion 102*f*. In some embodiments, the second conductive pad 102*g* is surrounded by the second dielectric layer 102*c* and is at least partially exposed through the second dielectric layer 102*c*. In some embodiments, the second conductive pad 102*g* is electrically connected to the second pad portion 102*e* through the second via portion 102*f*. In some embodiments, the second conductive pad 102*g* is in contact with the second via portion 102*f*. In some embodiments, the second conductive pad 102*g* include conductive material such as gold, silver, copper, nickel, tungsten, aluminum, tin, alloys thereof or the like. In some embodiments, a top surface of the second conductive pad 102*g* has a circular, quadrilateral or polygonal shape.

In some embodiments, the second bonding layer 102*h* is disposed over the second interconnect layer 102*b* and the second substrate 102*a*. In some embodiments, the second bonding layer 102*h* includes dielectric material such as oxide, nitride, silicon dioxide, silicon nitride, silicon oxynitride, silicon carbide, polymer or the like. In some embodiments, the second bonding layer 102*h* is configured to form a bond with another bonding layer. In some embodiments, a top surface of the second conductive pad 102*g* is exposed and is in contact with the second bonding layer 102*h*. In some embodiments, the second conductive pad 102*g* is partially covered by the second bonding layer 102*h*.

In some embodiments, a second via 102*i* is surrounded by the second bonding layer 102*h*. In some embodiments, the second via 102*i* extends through the second bonding layer 102*h* and is in contact with the second conductive pad 102*g*. In some embodiments, the second via 102*i* protrudes from the second conductive pad 102*g*. In some embodiments, the second via 102*i* includes conductive material such as gold, silver, copper, nickel, tungsten, aluminum, tin, alloys thereof, or the like. In some embodiments, the second via 102*i* extends in a direction orthogonal to the second conductive pad 102*g*.

In some embodiments, the first semiconductor structure 100 further includes a third die 103 stacked over the second die 102 and the first die 101. In some embodiments, the third die 103 is bonded over the second die 102, in a manner similar to that of the bonding of the second die 102 over the first die 101. In some embodiments, the third die 103 has a configuration similar to that of the second die 102 or the first die 101.

In some embodiments, a conductive bump 104 is disposed over the third die 103. In some embodiments, a third conductive pad 103*g* of the third die 103 is exposed through a passivation layer 103*h* to receive the conductive bump 104. In some embodiments, the conductive bump 104 is configured to connect to an external circuitry or an external interconnect structure. In some embodiments, the conductive bump 104 is electrically connected to the first die 101, the second die 102 and the third die 103 through the first via 101*i*, the second via 102*i* and the third via 102*k*.

In some embodiments, the conductive bump 104 includes low-temperature reflowable material. In some embodiments, the conductive bump 104 includes soldering material such as tin, lead, silver, copper, nickel, bismuth, or a combination thereof. In some embodiments, the conductive bump 104 includes conductive material such as gold, silver, copper, nickel, tungsten, aluminum, tin, alloys thereof, or the like. In some embodiments, the conductive bump 104 is a ball grid array (BGA) ball, a controlled collapse chip connection (C4) bump, a microbump or the like.

Figure 2:
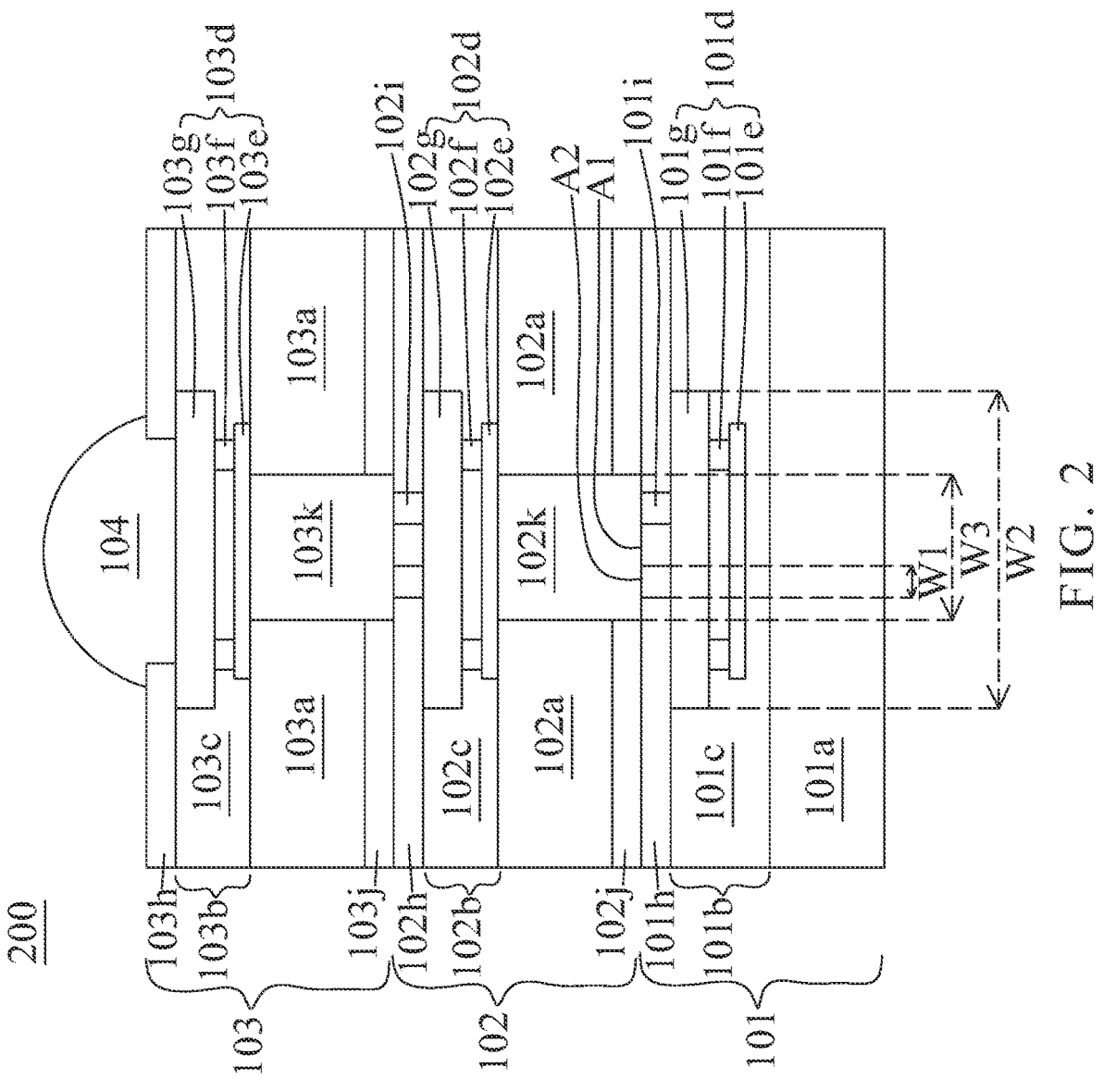
FIG. 2 is a cross-sectional view of a second semiconductor structure in accordance with some embodiments of the present disclosure.

FIG. 2 is a schematic cross-sectional view of a second semiconductor structure 200 in accordance with some embodiments of the present disclosure. In some embodiments, the second semiconductor structure 200 has configurations similar to those of the first semiconductor structure 100, except the second semiconductor structure 200 includes more than one first via 101*i*. Each of the first vias 101*i* extends through the first bonding layer 101*h*. In some embodiments, the first vias 101*i* extend between the first conductive pad 101*g* and the third via 102*k*.

Figure 9:
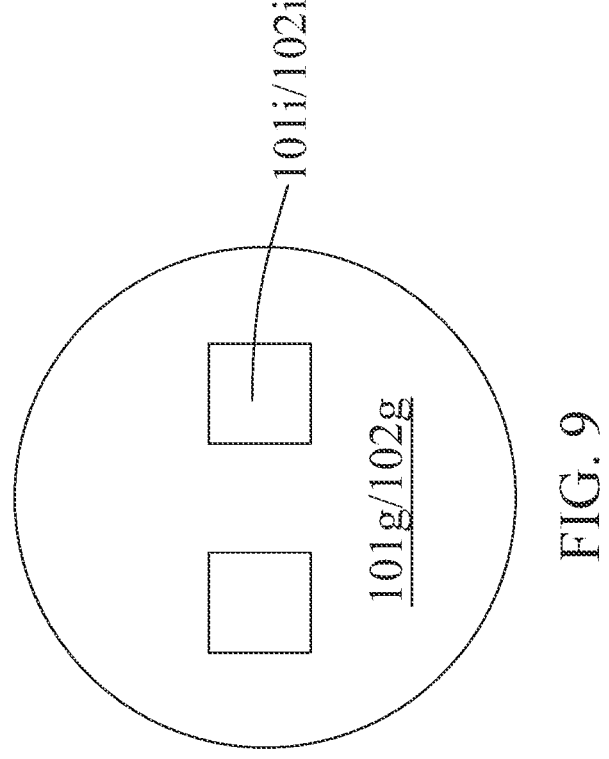
Figure 10:
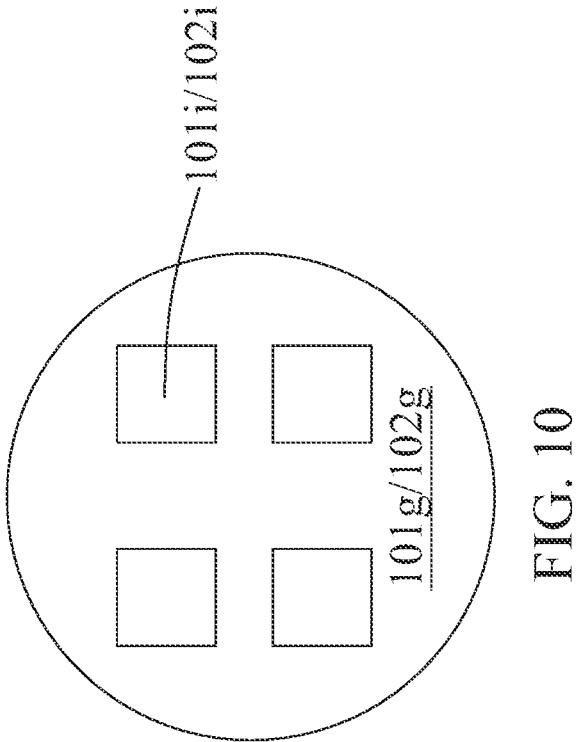

In some embodiments, the first width W1 of each of the first vias 101*i* is substantially less than the third width W3 of the third via 102*k*. In some embodiments, the first contact surface area A1 between the first bonding layer 101*h* and the third via 102*k* is substantially greater than or equal to a total of the second contact surface areas A2 between the first vias 101*i* and the third via 102*k*. In some embodiments, at least a portion of the first bonding layer 101*h* is between two adjacent first vias 101*i*. FIGS. 9 and 10 show the first vias 101*i* in various arrangements. As shown in FIG. 9, two first vias 101*i* are aligned horizontally with each other. As shown in FIG. 10, the first vias 101*i* are arranged in a matrix. In some embodiments, a cross-section of each of the first vias 101*i* has a circular, quadrilateral or polygonal shape.

Figure 3:
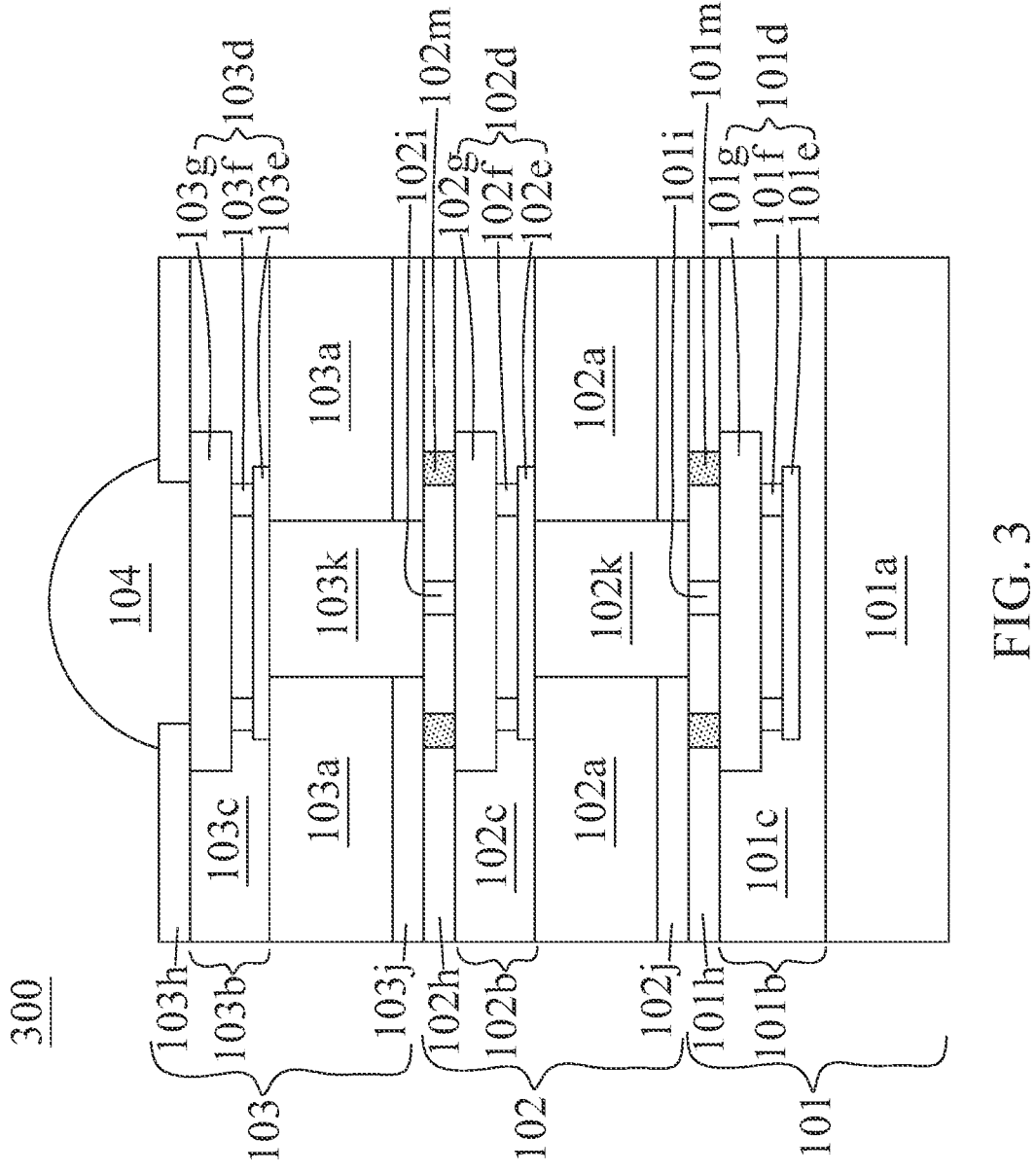
FIG. 3 is a cross-sectional view of a third semiconductor structure in accordance with some embodiments of the present disclosure.

FIG. 3 is a schematic cross-sectional view of a third semiconductor structure 300 in accordance with some embodiments of the present disclosure. In some embodiments, the third semiconductor structure 300 has configurations similar to those of the first semiconductor structure 100 or the second semiconductor structure 200, except a first alignment mark 101*m* and/or a second alignment mark 102*m* is/are included.

In some embodiments, the first alignment mark 101*m* is surrounded by the first bonding layer 101*h* and extends between the third bonding layer 102*j* and the first conductive pad 101*g*. In some embodiments, the first alignment marks 101*m* surround the first via 101*i*. In some embodiments, a portion of the first bonding layer 101*h* is disposed between the first via 101*i* and the first alignment mark 101*m*. In some embodiments, the second alignment mark 102*m* has configurations similar to those of the first alignment mark 101*m*.

In some embodiments, the first alignment mark 101*m* and the second alignment mark 102*m* are configured to align the first die 101 with the second die 102 or the second die 102 with the third die 103 during a bonding process. In some embodiments, the first alignment mark 101*m* and the second alignment mark 102*m* include conductive material such as gold, silver, copper, nickel, tungsten, aluminum, tin, alloys thereof, or the like.

Figure 4:
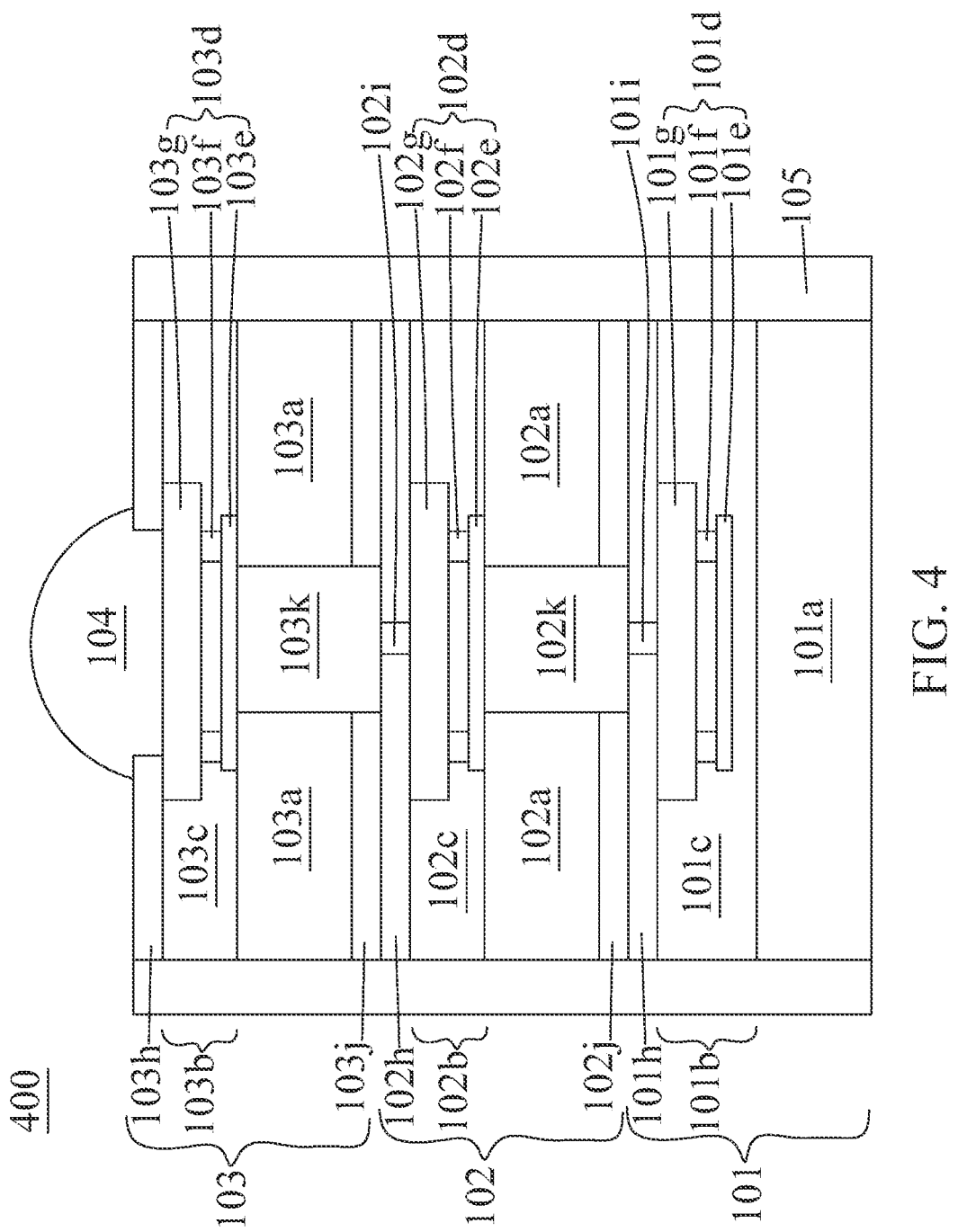
FIG. 4 is a cross-sectional view of a fourth semiconductor structure in accordance with some embodiments of the present disclosure.

FIG. 4 is a schematic cross-sectional view of a fourth semiconductor structure 400 in accordance with some embodiments of the present disclosure. In some embodiments, the fourth semiconductor structure 400 has configurations similar to those of the first semiconductor structure 100, the second semiconductor structure 200 or the third semiconductor structure 300, except the fourth semiconductor structure 400 includes a molding 105. In some embodiments, the molding 105 surrounds the first die 101 and the second die 102. In some embodiments, the molding 105 includes molding compound, epoxy, or the like.

Figure 5:
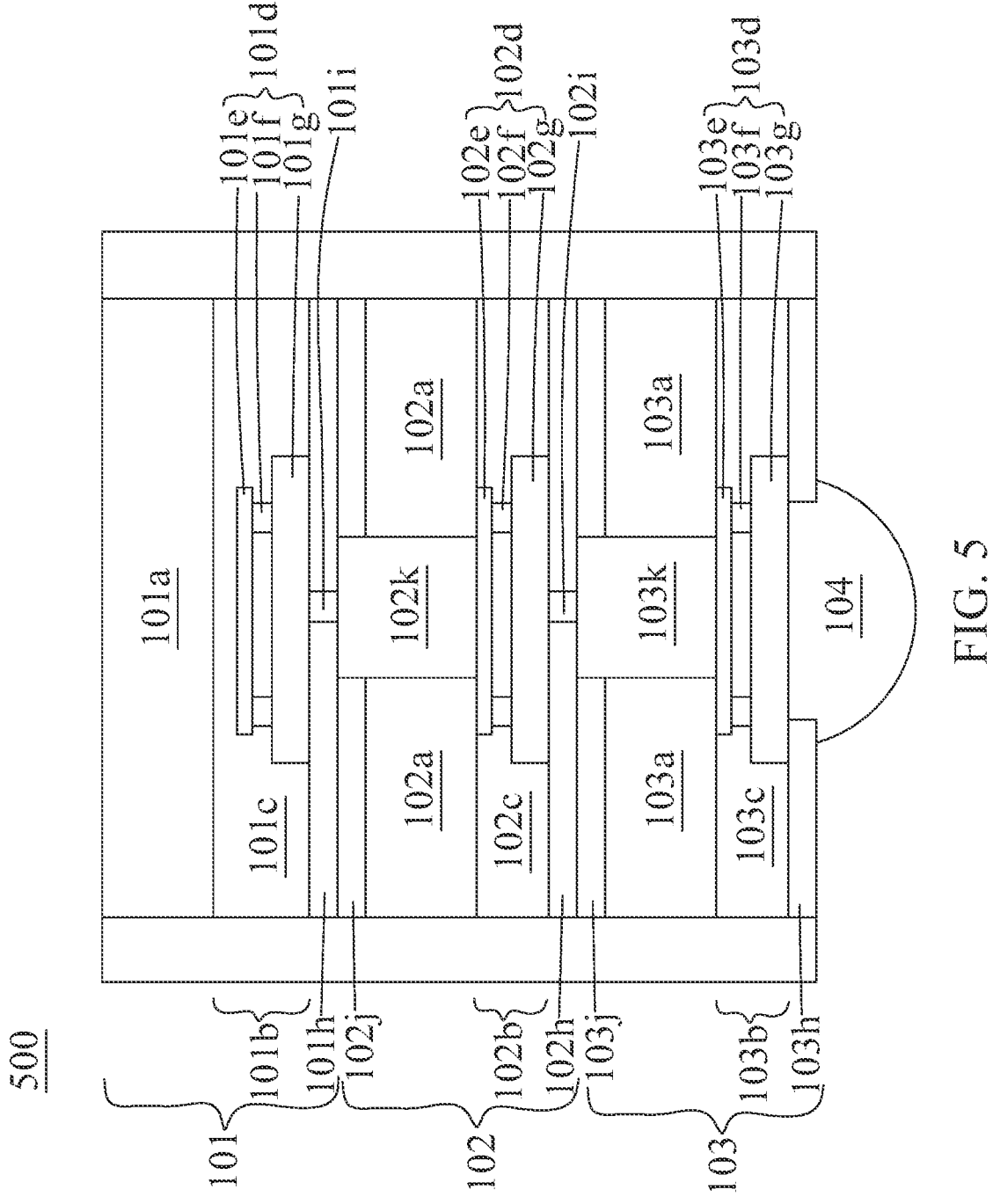
FIG. 5 is a cross-sectional view of a fifth semiconductor structure in accordance with some embodiments of the present disclosure.

FIG. 5 is a schematic cross-sectional view of a fifth semiconductor structure 500 in accordance with some embodiments of the present disclosure. The fifth semiconductor structure 500 is the fourth semiconductor structure 400 flipped upside down.

Figure 11:
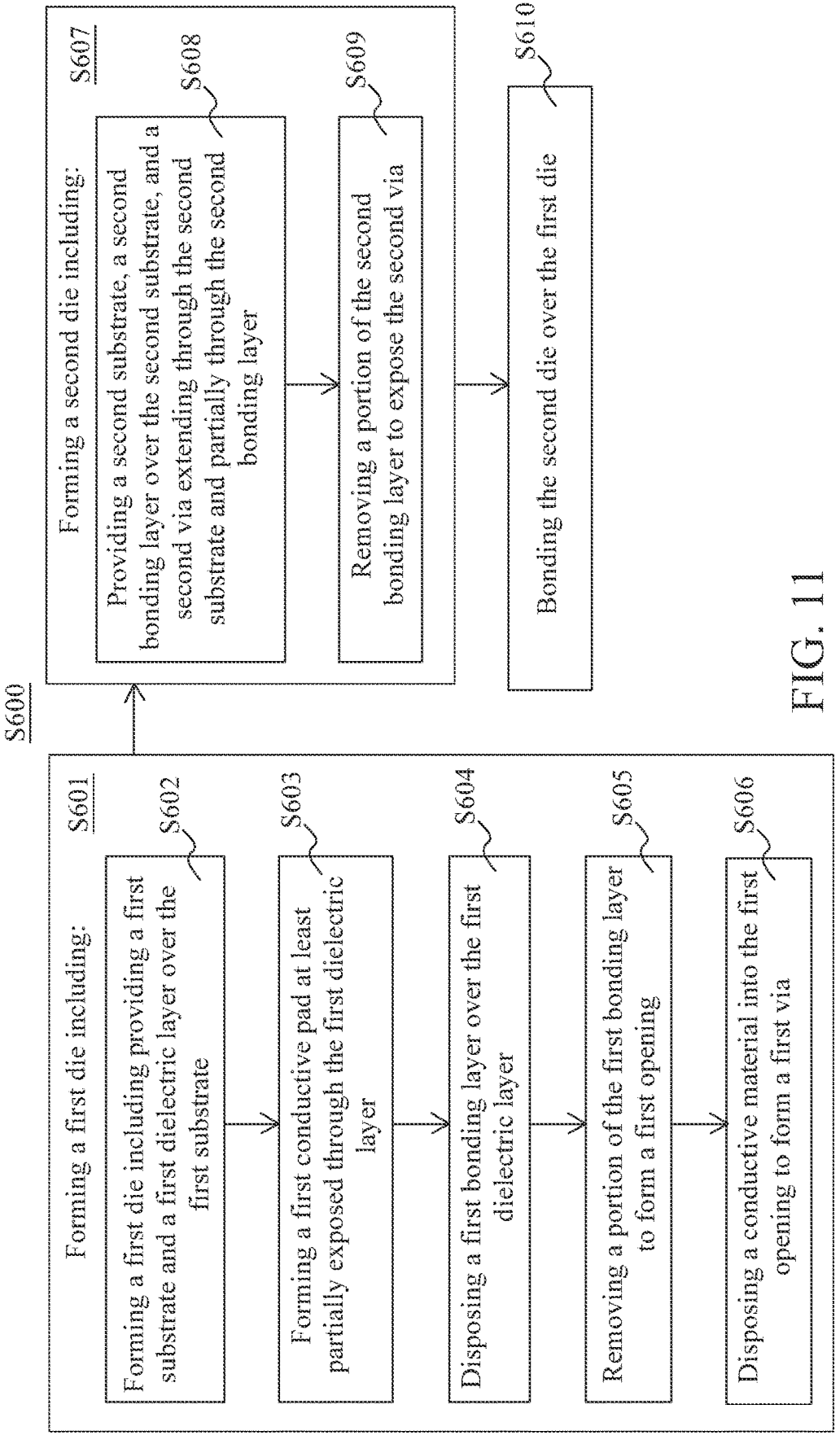
FIG. 11 is a flow diagram illustrating a method of manufacturing a semiconductor structure in accordance with some embodiments of the present disclosure.

FIG. 11 is a flow diagram illustrating a method S600 of manufacturing the first semiconductor structure 100 in accordance with some embodiments of the present disclosure, and FIGS. 12 to 36 illustrate cross-sectional views of intermediate stages in the formation of the first semiconductor structure 100 in accordance with some embodiments of the present disclosure.

The stages shown in FIGS. 12 to 36 are also illustrated schematically in the flow diagram in FIG. 11. In the following description, the fabrication stages shown in FIGS. 12 to 36 are discussed in reference to the process steps shown in FIG. 11. The method S600 includes a number of operations and the description and illustration are not deemed as a limitation to the sequence of the operations. The method S600 includes a number of steps (S601, S602, S603, S604, S605, S606, S607, S608, S609 and S610).

Figure 12:
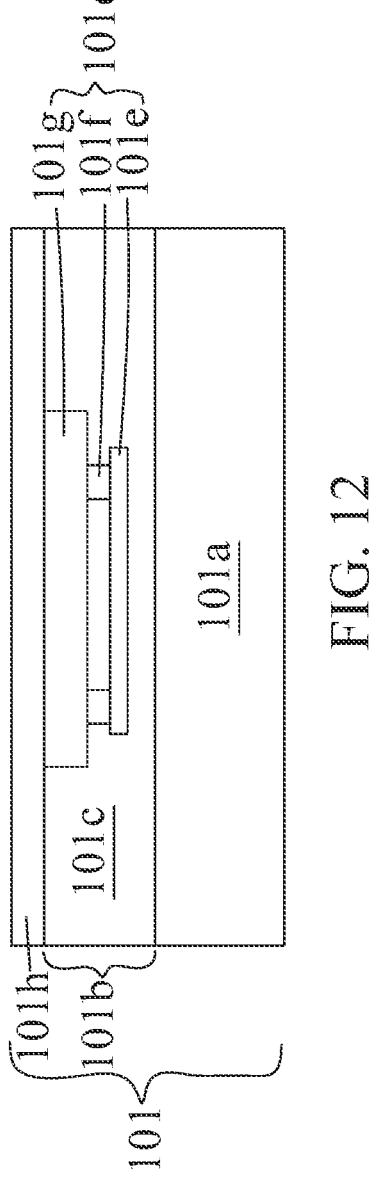
FIGS. 12 through 36 illustrate cross-sectional views of intermediate stages in the formation of a semiconductor structure in accordance with some embodiments of the present disclosure.

Referring to FIGS. 12 to 15, a first die 101 is formed according to step S601 in FIG. 11. Referring to FIG. 12, the formation of the first die 101 includes providing a first substrate 101*a* and a first dielectric layer 101*c* over the first substrate 101*a* according to step S602 in FIG. 11. In some embodiments, the first substrate 101*a* is a semiconductive layer. In some embodiments, the first substrate 101*a* includes semiconductive material such as silicon, germanium, gallium, arsenic, or a combination thereof. In some embodiments, the first substrate 101*a* is a silicon substrate.

In some embodiments, the first dielectric layer 101*c* is disposed above the first substrate 101*a*. In some embodiments, the first dielectric layer 101*c* includes dielectric material such as oxide, nitride, silicon dioxide, silicon nitride, silicon oxynitride, silicon carbide, polymer or the like. In some embodiments, the first dielectric layer 101*c* includes several dielectric layers stacked over each other. In some embodiments, each of the dielectric layers includes materials that are same as or different from materials in others of the dielectric layers. In some embodiments, the first dielectric layer 101*c* is formed by deposition, chemical vapor deposition (CVD) or another suitable process.

In some embodiments, a first interconnect structure 101*d* is formed within the first dielectric layer 101*c*. In some embodiments, the first interconnect structure 101*d* includes a first pad portion 101*e* and a first via portion 101*f*. In some embodiments, the first pad portion 101*e* and the first via portion 101*f* include conductive material such as gold, silver, copper, nickel, tungsten, aluminum, tin, alloys thereof, or the like. In some embodiments, the first pad portion 101*e* and the first via portion 101*f* are formed by removing several portions of the first dielectric layer 101*c* to form several recesses and disposing conductive materials to fill the recesses to form the first pad portion 101*e* and the first via portion 101*f*. In some embodiments, the conductive material is disposed by electroplating, sputtering or another suitable process.

Referring to FIG. 12, a first conductive pad 101*g* is formed according to step S603 in FIG. 11. In some embodiments, the first interconnect structure 101*d* includes the first conductive pad 101*g*. In some embodiments, the first conductive pad 101*g* is at least partially exposed through the first dielectric layer 101*c*. In some embodiments, the first conductive pad 101*g* is formed by removing a portion of the first dielectric layer 101*c* to form a recess, and then disposing conductive material to fill the recess to form the first conductive pad 101g. In some embodiments, the conductive material is disposed by electroplating, sputtering or another suitable process.

Referring to FIG. 12, a first bonding layer 101h is disposed over the first dielectric layer 101c according to step S604 in FIG. 11. In some embodiments, the first bonding layer 101h includes dielectric material such as oxide, nitride, silicon dioxide, silicon nitride, silicon oxynitride, silicon carbide, polymer or the like. In some embodiments, a top surface of the first conductive pad 101g is entirely covered by and in contact with the first bonding layer 101h. In some embodiments, the first bonding layer 101h is disposed by deposition, chemical vapor deposition (CVD) or another suitable process.

Figure 13:
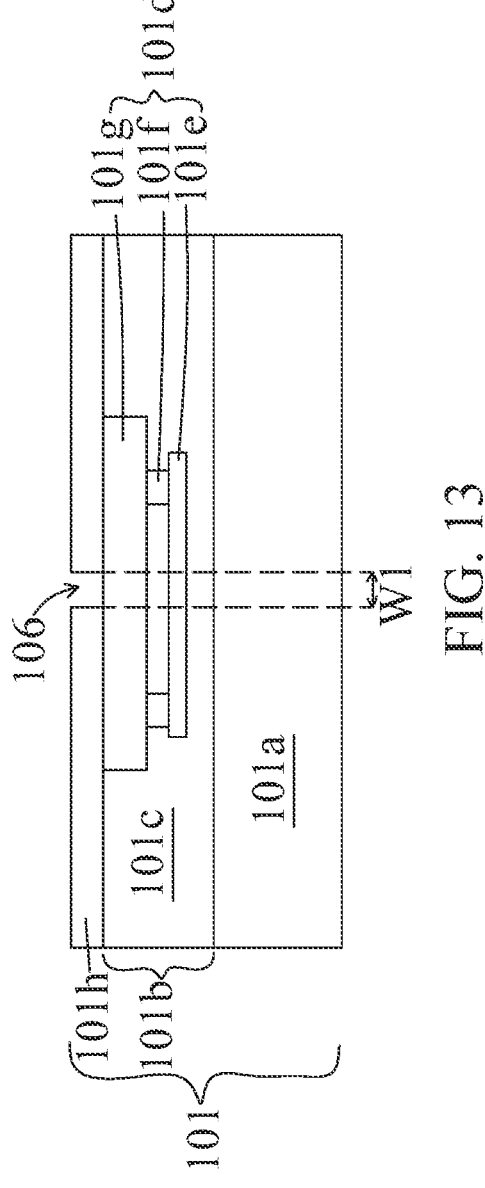

Referring to FIG. 13, a portion of the first bonding layer 101h is removed to form a first opening 106 according to step S605. In some embodiments, the first opening 106 extends through the first bonding layer 101h to expose at least a portion of the top surface of the first conductive pad 101g. In some embodiments, the portion of the first bonding layer 101h is removed by etching or any other suitable process. In some embodiments, a first width W1 of the first opening 106 is substantially less than 2 μm. In some embodiments, the first opening 106 has a circular, quadrilateral or polygonal shape.

Figure 14:
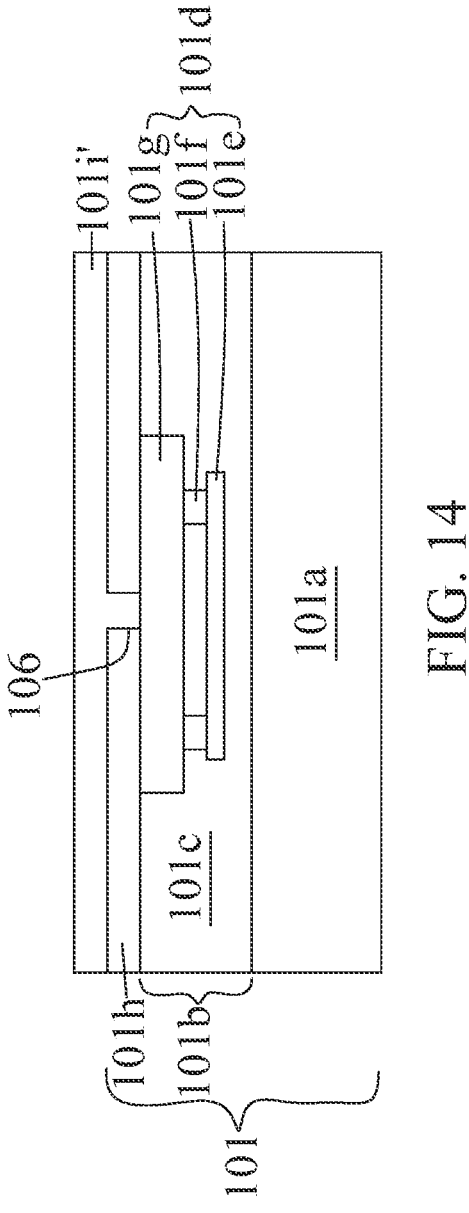
Figure 15:
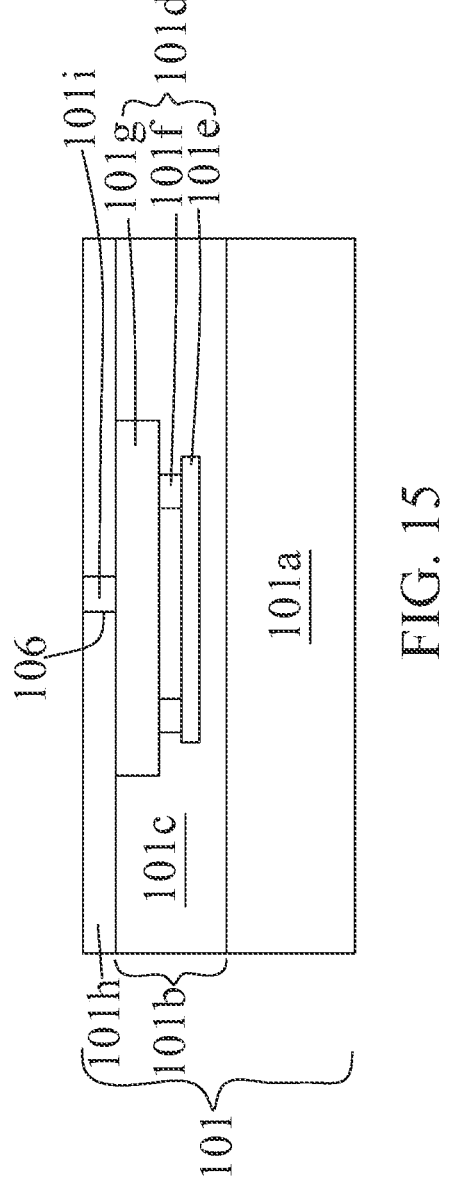

Referring to FIGS. 14 to 15, a conductive material 101i' is disposed into the first opening 106 to form the first via 101i according to step S606 in FIG. 11. In some embodiments, the conductive material 101i' is disposed over the first bonding layer 101h and into the first opening 106 as shown in FIG. 14. In some embodiments, the conductive material 101i' includes gold, silver, copper, nickel, tungsten, aluminum, tin, alloys thereof, or the like. In some embodiments, the conductive material 101i' is disposed by chemical vapor deposition (CVD), physical vapor deposition (PVD), sputtering or another suitable process.

After the disposing of the conductive material 101i' as shown in FIG. 14, a portion of the conductive material 101i' on the first bonding layer 101h is removed to form the first via 101i as shown in FIG. 15. In some embodiments, the portion of the conductive material 101i' is removed by planarization, etching, chemical mechanical planarization (CMP) or another suitable process. In some embodiments, the first via 101i extends through the first bonding layer 101h and is in contact with the first conductive pad 101g. In some embodiments, the first via 101i protrudes from the first conductive pad 101g. In some embodiments, the first die 101 is formed as shown in FIG. 15.

Referring to FIGS. 16 to 21, a second die 102 is formed according to step S607 in FIG. 11. In some embodiments, the formation of the second die 102 includes providing a second substrate 102a, a third bonding layer 102j over the second substrate 102a, and a third via 102k extending through the second substrate 102a and partially through the third bonding layer 102j according to step S608 in FIG. 11.

Figure 16:
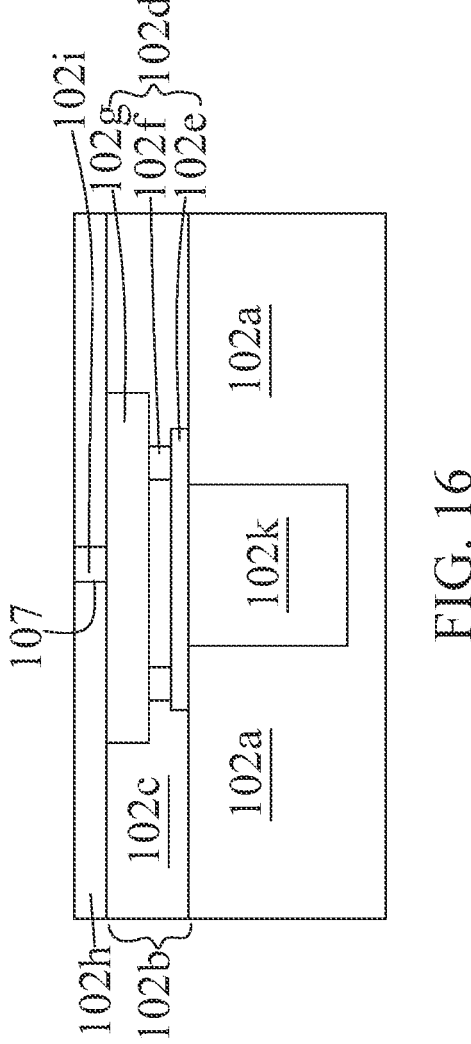

Referring to FIG. 16, the second die 102 includes a second interconnect layer 102b over the second substrate 102a, and a second bonding layer 102h over the second interconnect layer 102b. In some embodiments, the second substrate 102a is a semiconductive layer. In some embodiments, the second substrate 102a includes semiconductive material such as silicon, germanium, gallium, arsenic, or a combination thereof. In some embodiments, the second substrate 102a is a silicon substrate.

In some embodiments, the third via 102k extends partially through the second substrate 102a. In some embodiments, the third via 102k is a through substrate via (TSV). In some embodiments, the third via 102k includes conductive material such as gold, silver, copper, nickel, tungsten, aluminum, tin, alloys thereof or the like. In some embodiments, the first via 101i and the third via 102k include a same material.

In some embodiments, a second dielectric layer 102c is disposed above the second substrate 102a. In some embodiments, the second dielectric layer 102c includes dielectric material such as oxide, nitride, silicon dioxide, silicon nitride, silicon oxynitride, silicon carbide, polymer or the like. In some embodiments, the second dielectric layer 102c includes several dielectric layers stacked over each other. In some embodiments, each of the dielectric layers includes materials that are same as or different from materials in others of the dielectric layers. In some embodiments, the second dielectric layer 102c is formed by deposition, chemical vapor deposition (CVD) or another suitable process.

In some embodiments, a second interconnect structure 102d is formed within the second dielectric layer 102c. In some embodiments, the second interconnect structure 102d includes a second pad portion 102e and a second via portion 102f. In some embodiments, the second pad portion 102e and the second via portion 102f include conductive material such as gold, silver, copper, nickel, tungsten, aluminum, tin, alloys thereof, or the like. In some embodiments, the second pad portion 102e and the second via portion 102f are formed by removing several portions of the second dielectric layer 102c to form several recesses and disposing conductive materials to fill the recesses to form the second pad portion 102e and the second via portion 102f. In some embodiments, the conductive material is disposed by electroplating, sputtering or another suitable process.

In some embodiments, a second conductive pad 102g is formed. In some embodiments, the second interconnect structure 102d includes the second conductive pad 102g. In some embodiments, the second conductive pad 102g is at least partially exposed through the second dielectric layer 102c. In some embodiments, the second conductive pad 102g is formed by removing a portion of the second dielectric layer 102c to form a recess and disposing conductive material to fill the recess to form the second conductive pad 102g. In some embodiments, the conductive material is disposed by electroplating, sputtering or another suitable process.

In some embodiments, the second bonding layer 102h is disposed over the second dielectric layer 102c. In some embodiments, the second bonding layer 102h includes dielectric material such as oxide, nitride, silicon dioxide, silicon nitride, silicon oxynitride, silicon carbide, polymer or the like. In some embodiments, a top surface of the second conductive pad 102g is entirely covered by and in contact with the second bonding layer 102h. In some embodiments, the second bonding layer 102h is disposed by deposition, chemical vapor deposition (CVD) or another suitable process.

In some embodiments, a portion of the second bonding layer 102h is removed to form a second opening 107. In some embodiments, the second opening 107 extends through the second bonding layer 102h to expose at least a portion of the top surface of the second conductive pad 102g. In some embodiments, the portion of the second bonding layer 102h is removed by etching or any other suitable process.

In some embodiments, a conductive material is disposed into the second opening 107 to form the second via 102i. In some embodiments, the conductive material is disposed over the second bonding layer 102h and into the second opening 107. In some embodiments, the conductive material includes gold, silver, copper, nickel, tungsten, aluminum, tin, alloys thereof, or the like. In some embodiments, the conductive material is disposed by chemical vapor deposition (CVD), physical vapor deposition (PVD), sputtering or another suitable process.

After the disposing of the conductive material, a portion of the conductive material on the second bonding layer 102*h* is removed to form the second via 102*i*. In some embodiments, the portion of the conductive material is removed by planarization, etching, chemical mechanical planarization (CMP) or another suitable process. In some embodiments, the second via 102*i* extends through the second bonding layer 102*h* and is in contact with the second conductive pad 102*g*. In some embodiments, the second via 102*i* protrudes from the second conductive pad 102*g*.

Figure 17:
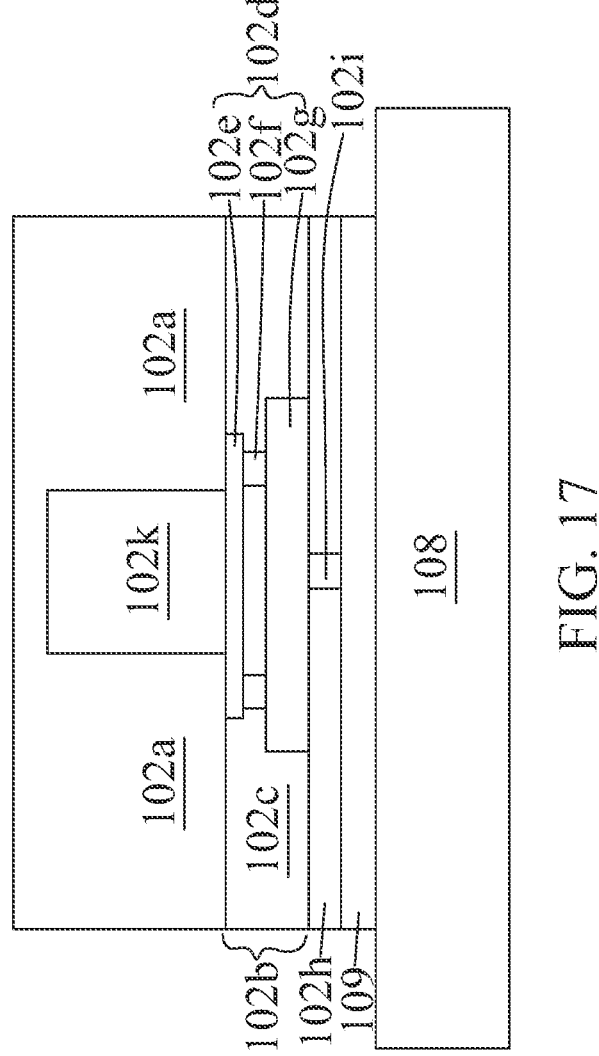

In some embodiments, an intermediate structure as shown in FIG. 16 is flipped and attached to a carrier substrate 108 by an adhesive 109 as shown in FIG. 17. In some embodiments, the carrier substrate 108 is a blank or dummy substrate for supporting the intermediate structure to undergo further processing. In some embodiments, the intermediate structure is detachable from the carrier substrate 108. In some embodiments, the second bonding layer 102*h* faces toward the carrier substrate 108.

Figure 18:
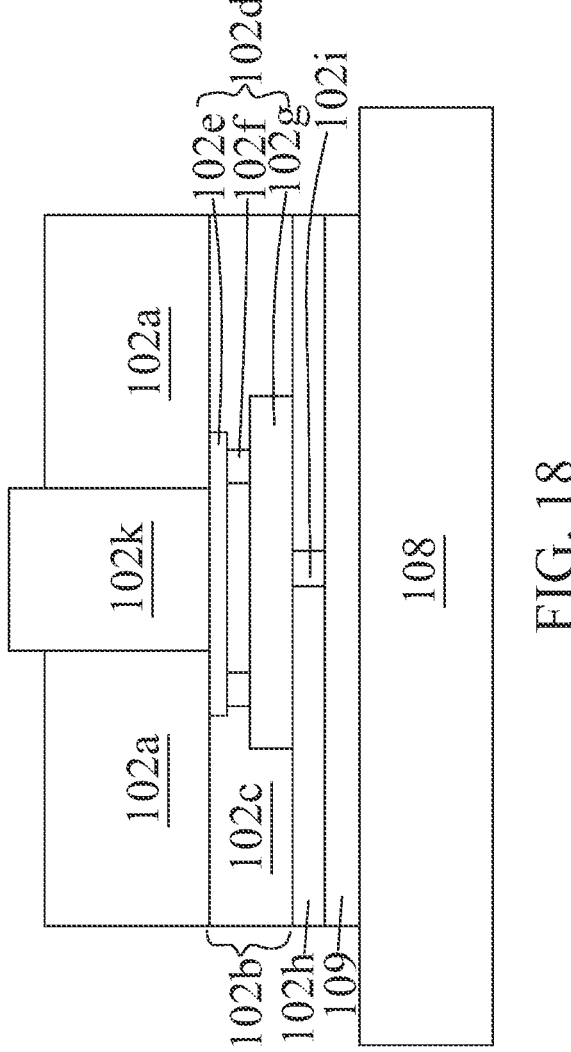

In some embodiments, a portion of the second substrate 102*a* is removed to expose at least a portion of the third via 102*k* as shown in FIG. 18. In some embodiments, the portion of the second substrate 102*a* is removed by planarization, etching, chemical mechanical planarization (CMP) or another suitable process. In some embodiments, at least a portion of the third via 102*k* protrudes from the second substrate 102*a*.

Figure 19:
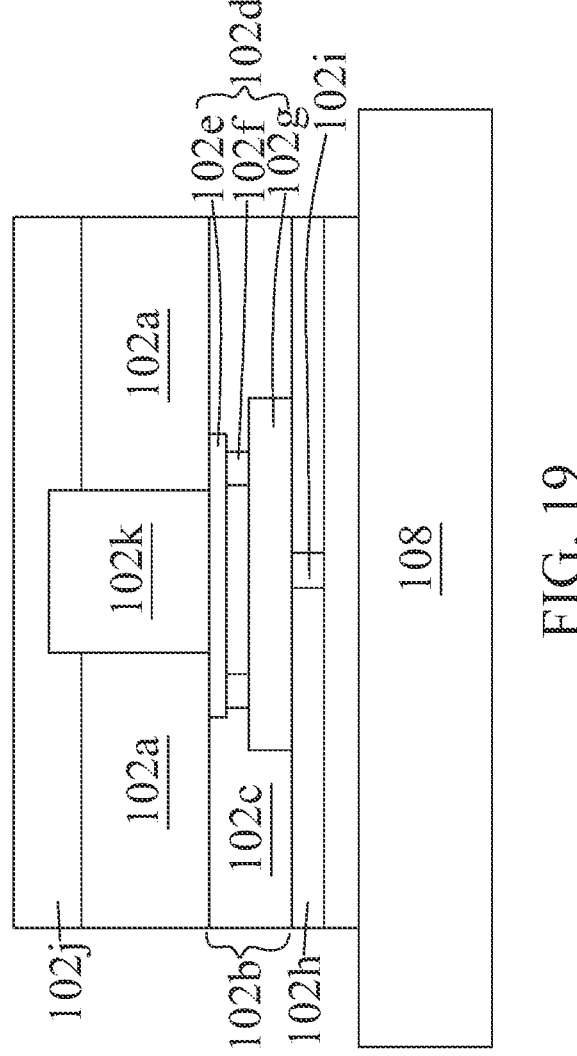

In some embodiments, the third bonding layer 102*j* is disposed over the second substrate 102*a* and the third via 102*k* as shown in FIG. 19. In some embodiments, the third bonding layer 102*j* includes dielectric material such as oxide, nitride, silicon dioxide, silicon nitride, silicon oxynitride, silicon carbide, polymer or the like. In some embodiments, the second substrate 102*a* and the third via 102*k* are entirely covered by the third bonding layer 102*j*. In some embodiments, the third bonding layer 102*j* is disposed by deposition, chemical vapor deposition (CVD) or another suitable process.

Figure 20:
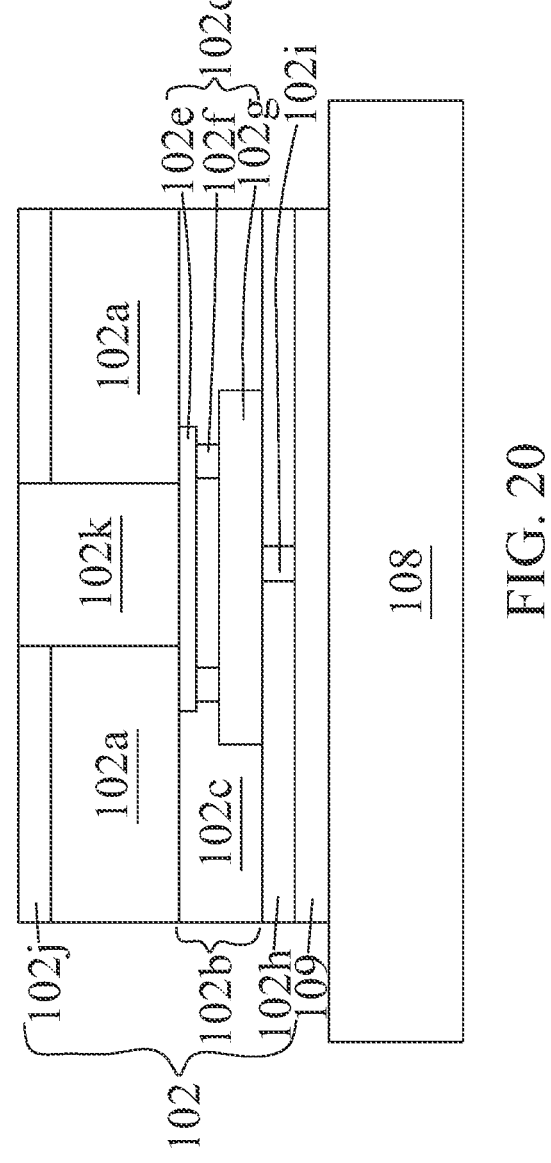
Figure 21:
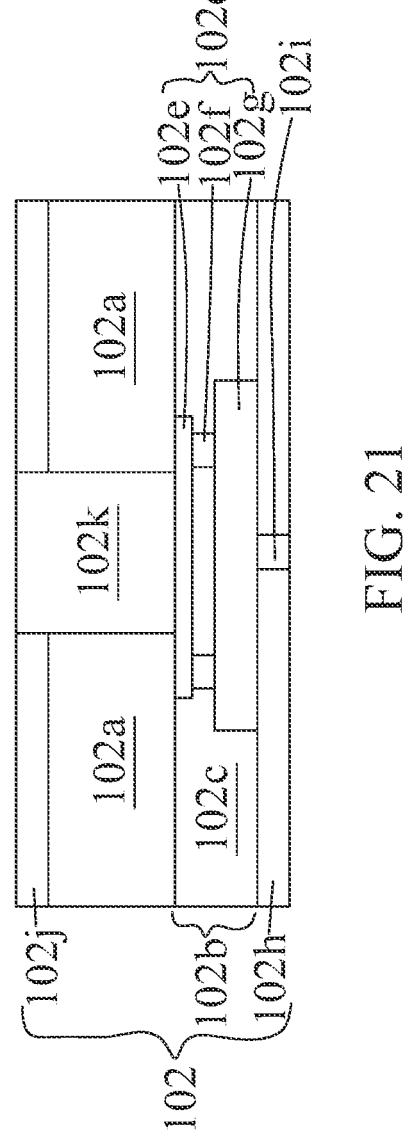

Referring to FIG. 20, a portion of the third bonding layer 102*j* is removed to expose at least a portion of a top surface of the third via 102*k* according to step S609 in FIG. 11. In some embodiments, the portion of the third bonding layer 102*j* is removed by planarization, etching, chemical mechanical planarization (CMP) or another suitable process. In some embodiments, the third via 102*k* extends through the second substrate 102*a* and the third bonding layer 102*j*. In some embodiments, the carrier substrate 108 is removed as shown in FIG. 21. In some embodiments, the second die 102 is formed as shown in FIG. 21.

Figure 22:
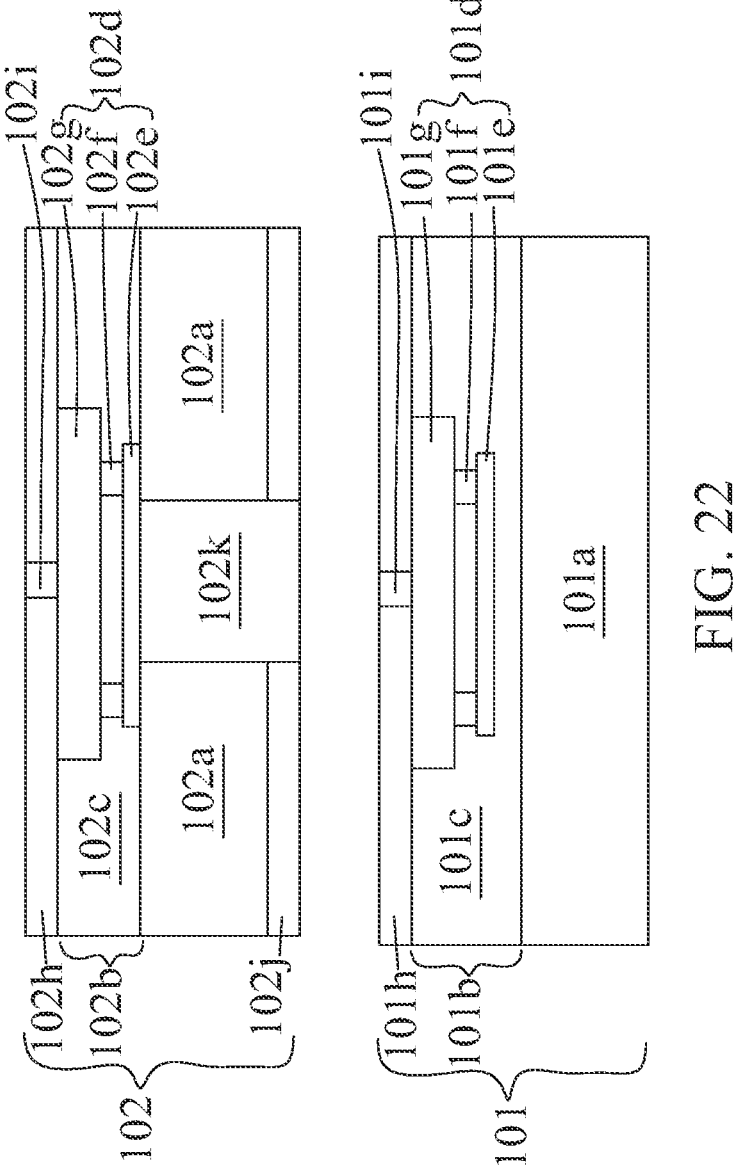

Referring to FIG. 22, the first die 101 and the second die 102 are respectively formed. In some embodiments, the formation of the first die 101 is performed prior to or after the formation of the second die 102. In some embodiments, the formation of the first die 101 and the formation of the second die 102 are performed simultaneously or separately. In some embodiments, the second die 102 is flipped after the formation of the second die 102 and prior to the bonding of the second die 102 over the first die 101.

Figure 23:
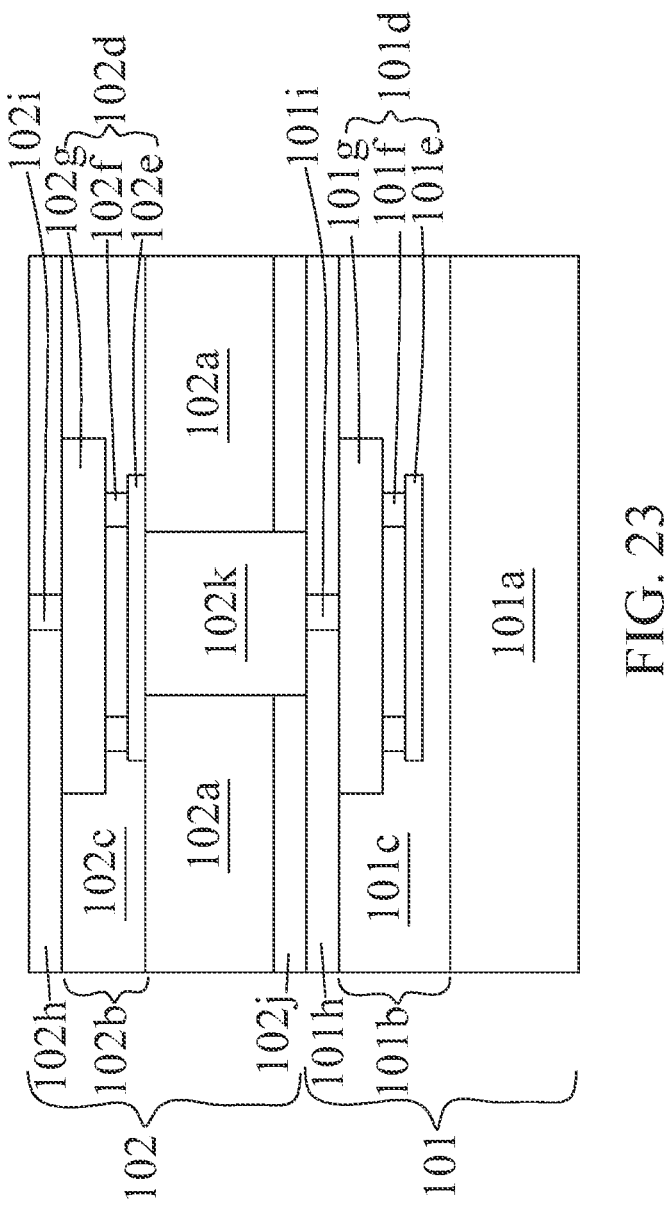

Referring to FIG. 23, the second die 102 is bonded over the first die 101 according to step S610 in FIG. 11. In some embodiments, a hybrid bonding is formed between the first die 101 and the second die 102. In some embodiments, the hybrid bonding includes bonding the third via 102*k* to the first via 101*i*, and bonding the first bonding layer 101*h* to the third bonding layer 102*j*. In some embodiments, a portion of the third via 102*k* is bonded to the first bonding layer 101*h*.

Figure 24:
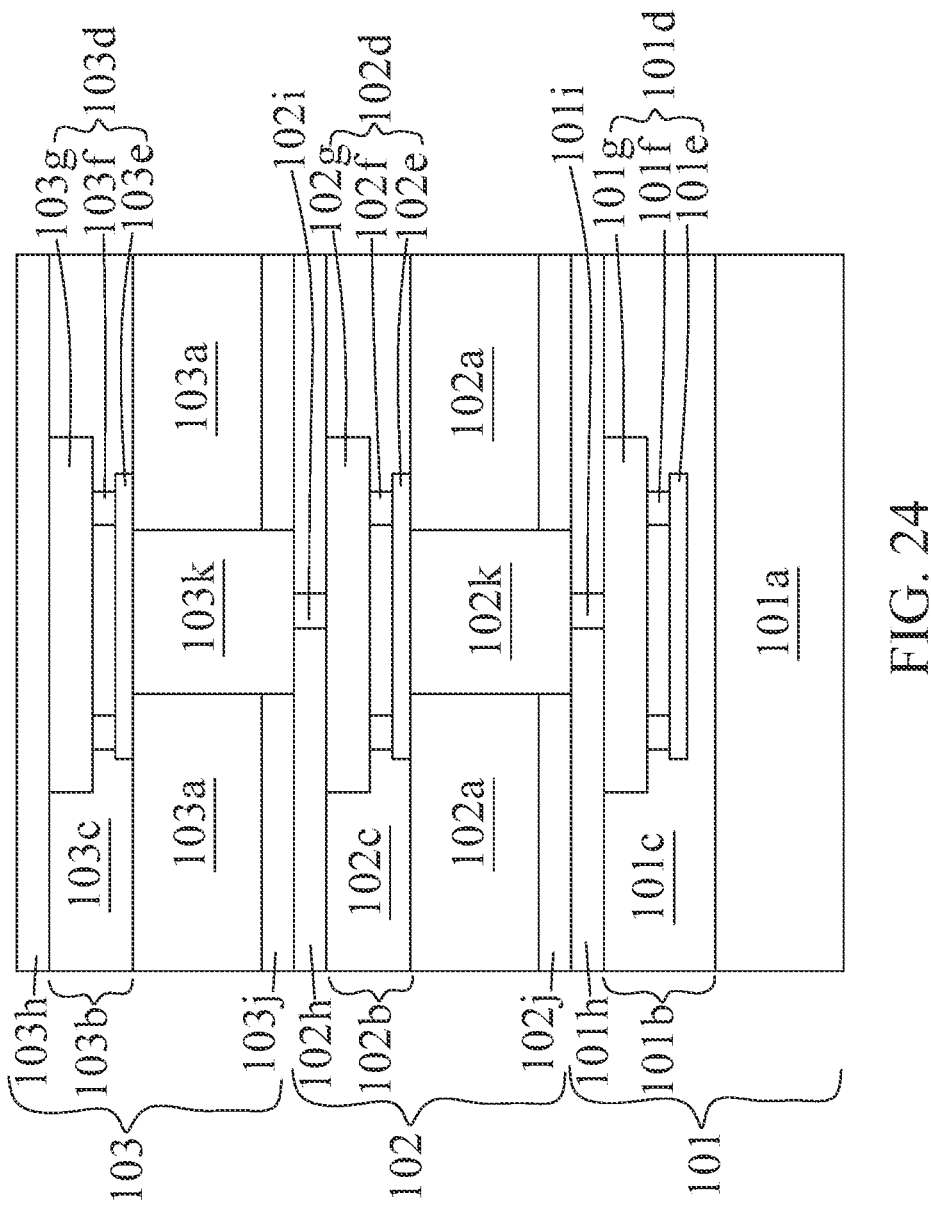

In some embodiments, a third die 103 is bonded over the second die 102 as shown in FIG. 24. The third die 103 is formed in a manner similar to that of the formation of the second die 102, and the third die 103 is bonded over the second die 102 in a manner similar to that of the bonding of the second die 102 over the first die 101.

Figure 25:
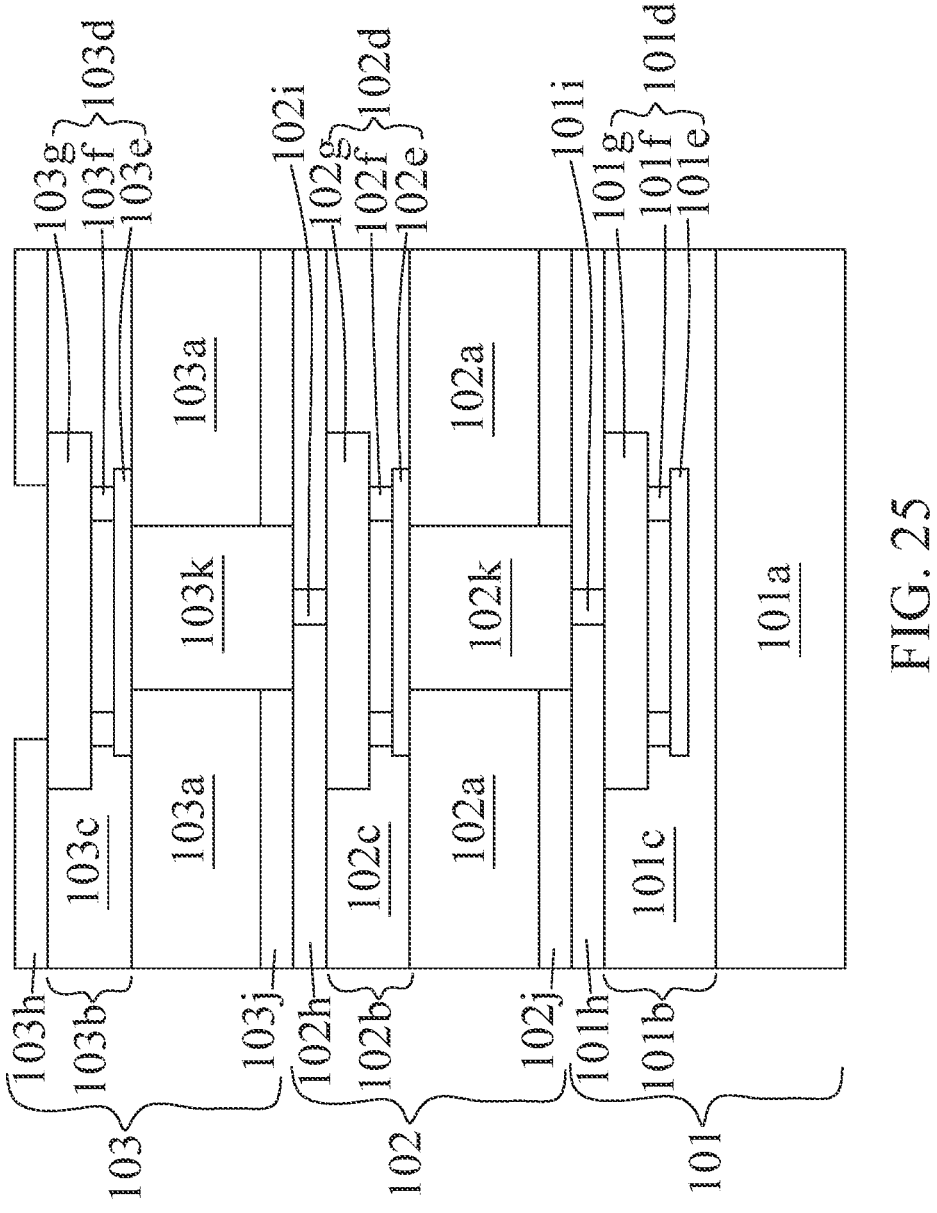
Figure 26:
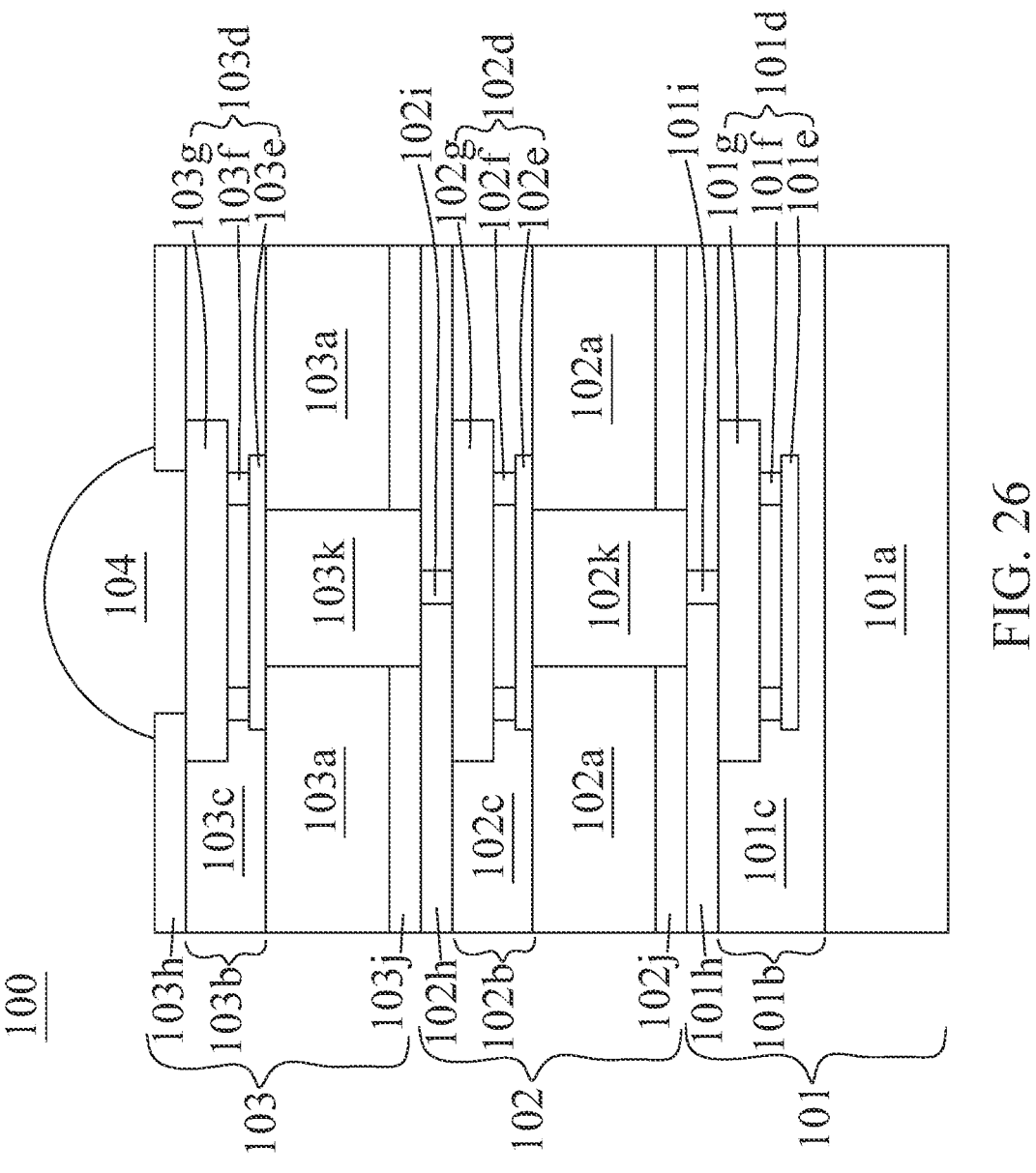

In some embodiments, a conductive bump 104 is formed as shown in FIGS. 25 to 26. In some embodiments, a portion of a passivation layer 103*h* is removed to expose a portion of a third conductive pad 103*g* as shown in FIG. 25, and then the conductive bump 104 is formed over the third conductive pad 103*g* as shown in FIG. 26. In some embodiments, the conductive bump 104 is electrically connected to the first die 101, the second die 102 and the third die 103.

Figure 27:
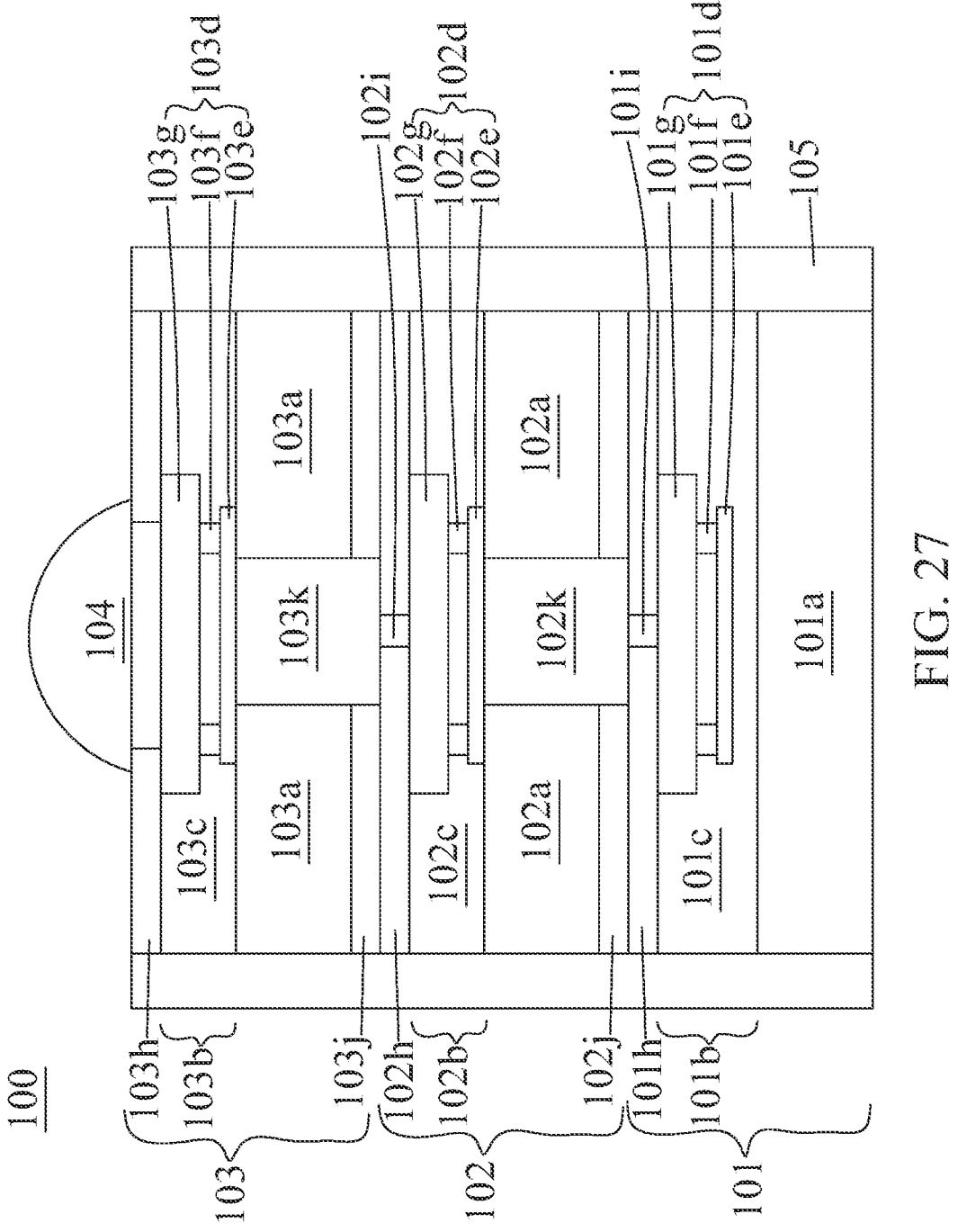

In some embodiments, the conductive bump 104 includes low-temperature reflowable material. In some embodiments, the conductive bump 104 includes soldering material such as tin, lead, silver, copper, nickel, bismuth, or a combination thereof. In some embodiments, the conductive bump 104 includes conductive material such as gold, silver, copper, nickel, tungsten, aluminum, tin, alloys thereof, or the like. In some embodiments, the conductive bump 104 is a ball grid array (BGA) ball, a controlled collapse chip connection (C4) bump, a microbump or the like. In some embodiments, a first semiconductor structure 100 as shown in FIG. 1 is formed. In some embodiments, a molding 105 is formed to surround the first die 101, the second die 102 and the third die 103 as shown in FIG. 27.

Figure 28:
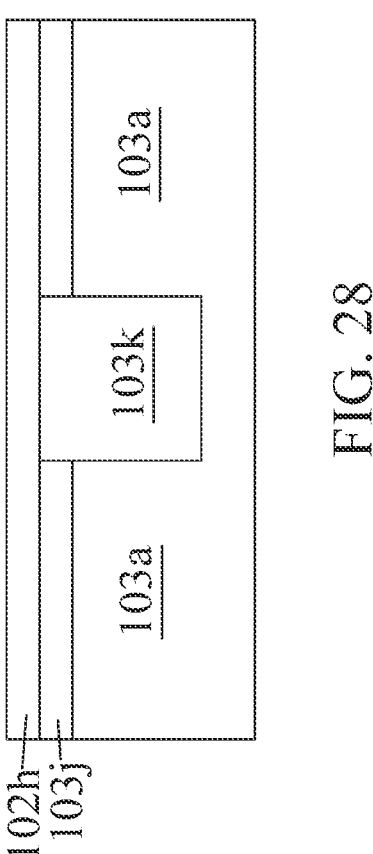

In some embodiments, the third die 103, the second bonding layer 102*h* and the second via 102*i* are formed as shown in FIGS. 28 to 36. In some embodiments, the formation of the third die 103 includes providing a third substrate 103*a* and a fourth bonding layer 103*j* over the third substrate 103*a*, and a fourth via 103*k* extending partially through the third substrate 103*a*, as shown in FIG. 28. In some embodiments, the second bonding layer 102*h* is disposed over the fourth bonding layer 103*j*.

Figure 29:
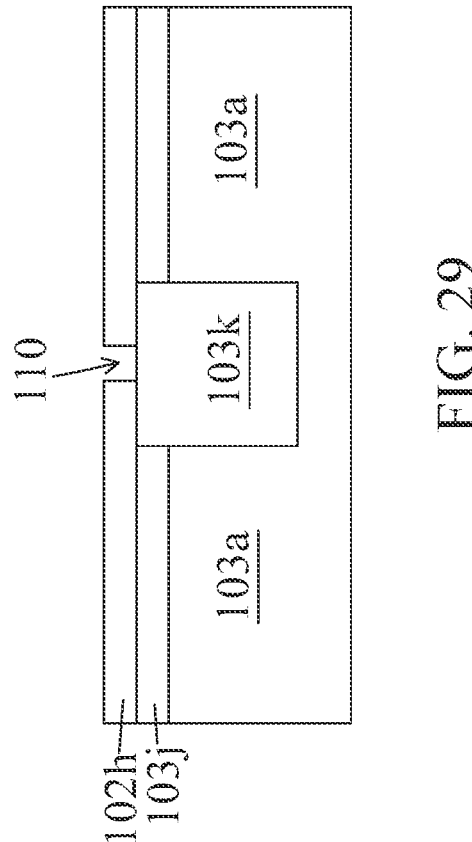
Figure 30:
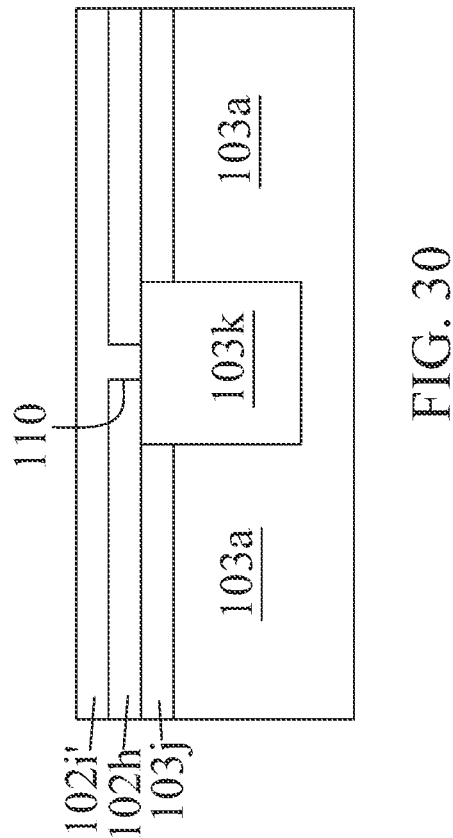
Figure 31:
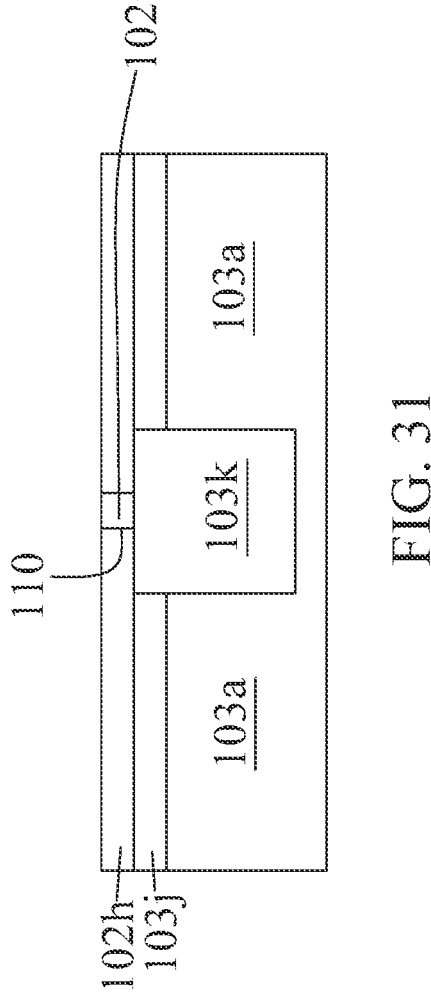

In some embodiments, a portion of the second bonding layer 102*h* is removed to form a third opening 110 as shown in FIG. 29. In some embodiments, a portion of a top surface of the fourth via 103*k* is exposed through the second bonding layer 102*h*. After the formation of the third opening 110, a conductive material 102*i'* is disposed over the second bonding layer 102*h* and within the third opening 110 as shown in FIG. 30. In some embodiments, the conductive material 102*i'* disposed on the second bonding layer 102*h* is removed to form the second via 102*i* within the third opening 110 as shown in FIG. 31. In some embodiments, the second via 102*i* is in contact with the fourth via 103*k*.

Figure 32:
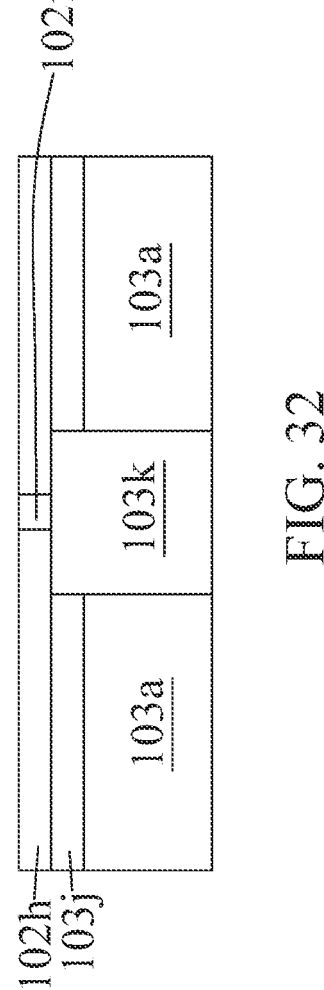
Figure 33:
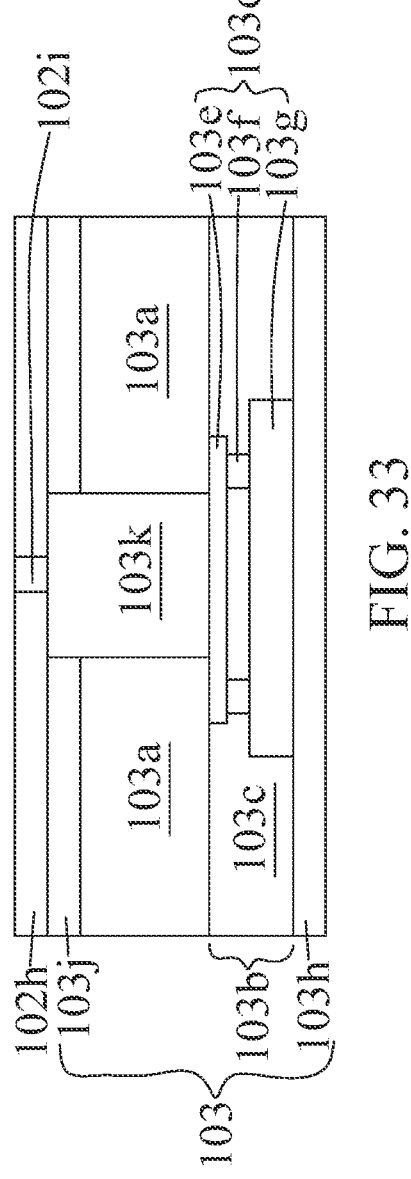

In some embodiments, a portion of the third substrate 103*a* is removed to expose at least a portion of a bottom surface of the fourth via 103*k* as shown in FIG. 32. In some embodiments, a third interconnect layer 103*b* is formed under the third substrate 103*a* as shown in FIG. 33. In some embodiments, the third interconnect layer 103*b* is formed in a manner similar to that of the formation of the second interconnect layer 102*b* as discussed above. In some embodiments, a fifth bonding layer 103*h* is disposed under the third interconnect layer 103*b* after the formation of the third interconnect layer 103*b*.

Figure 34:
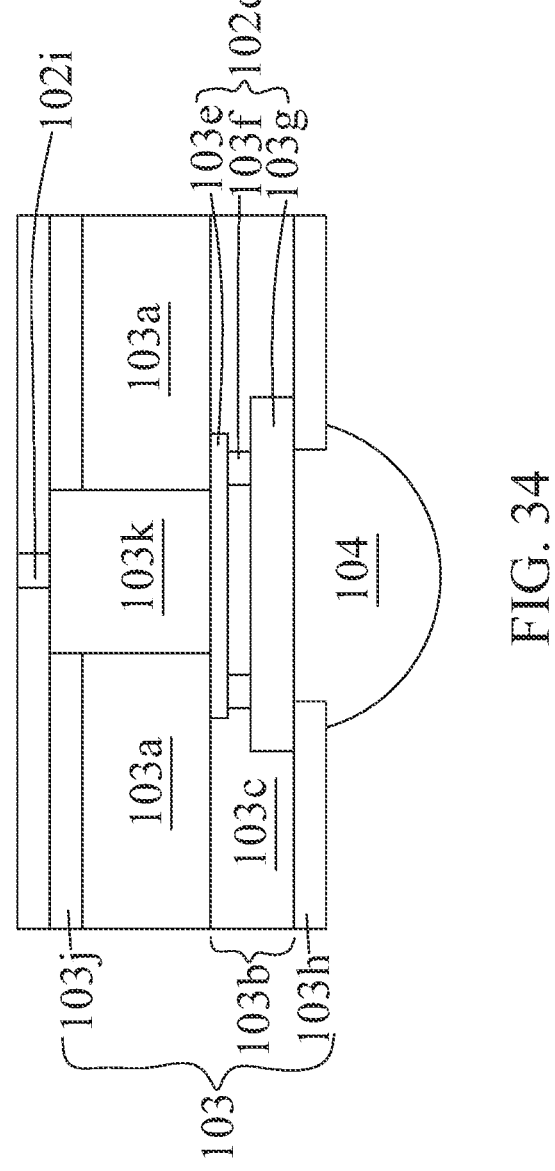
Figure 35:
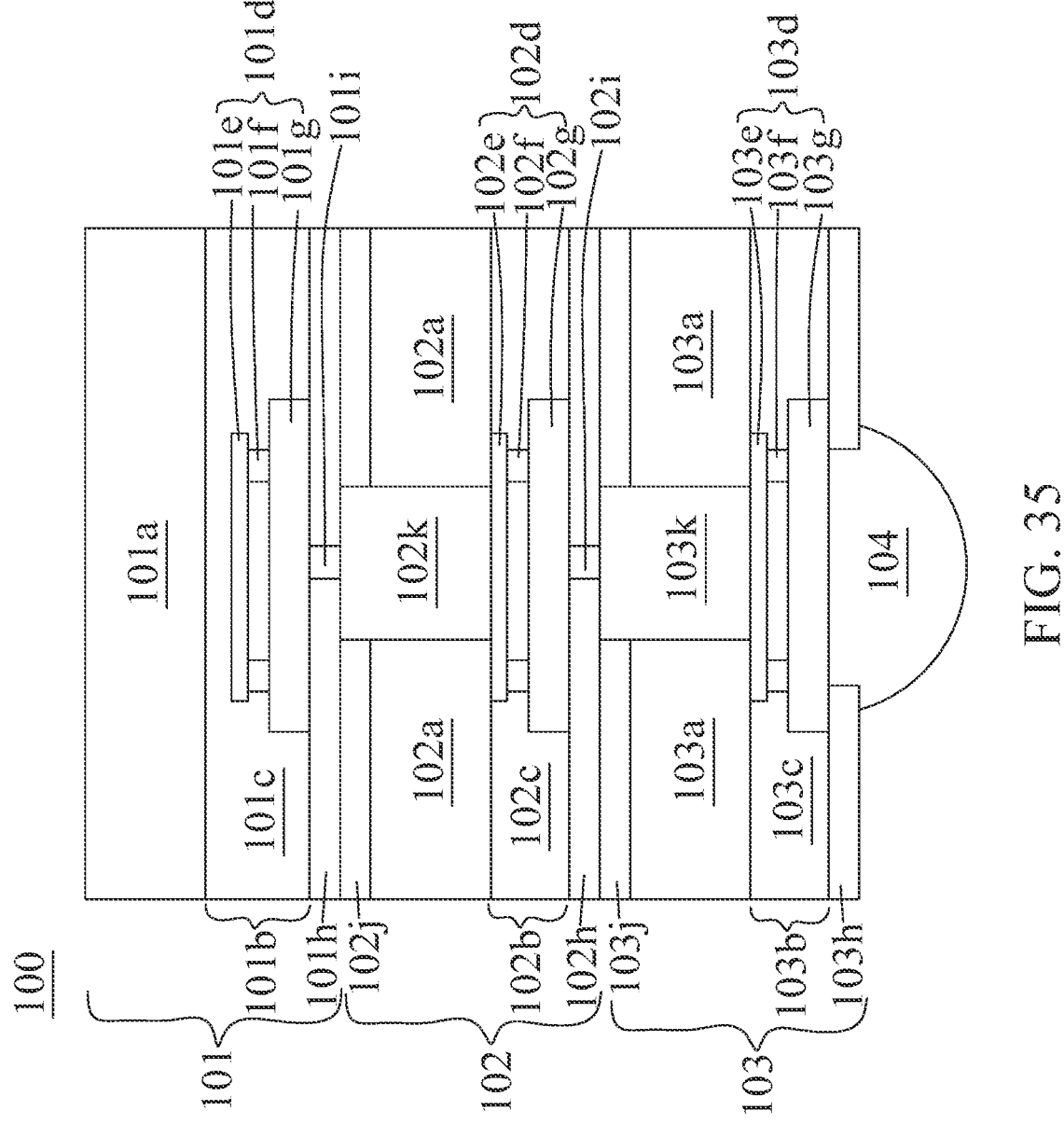
Figure 36:
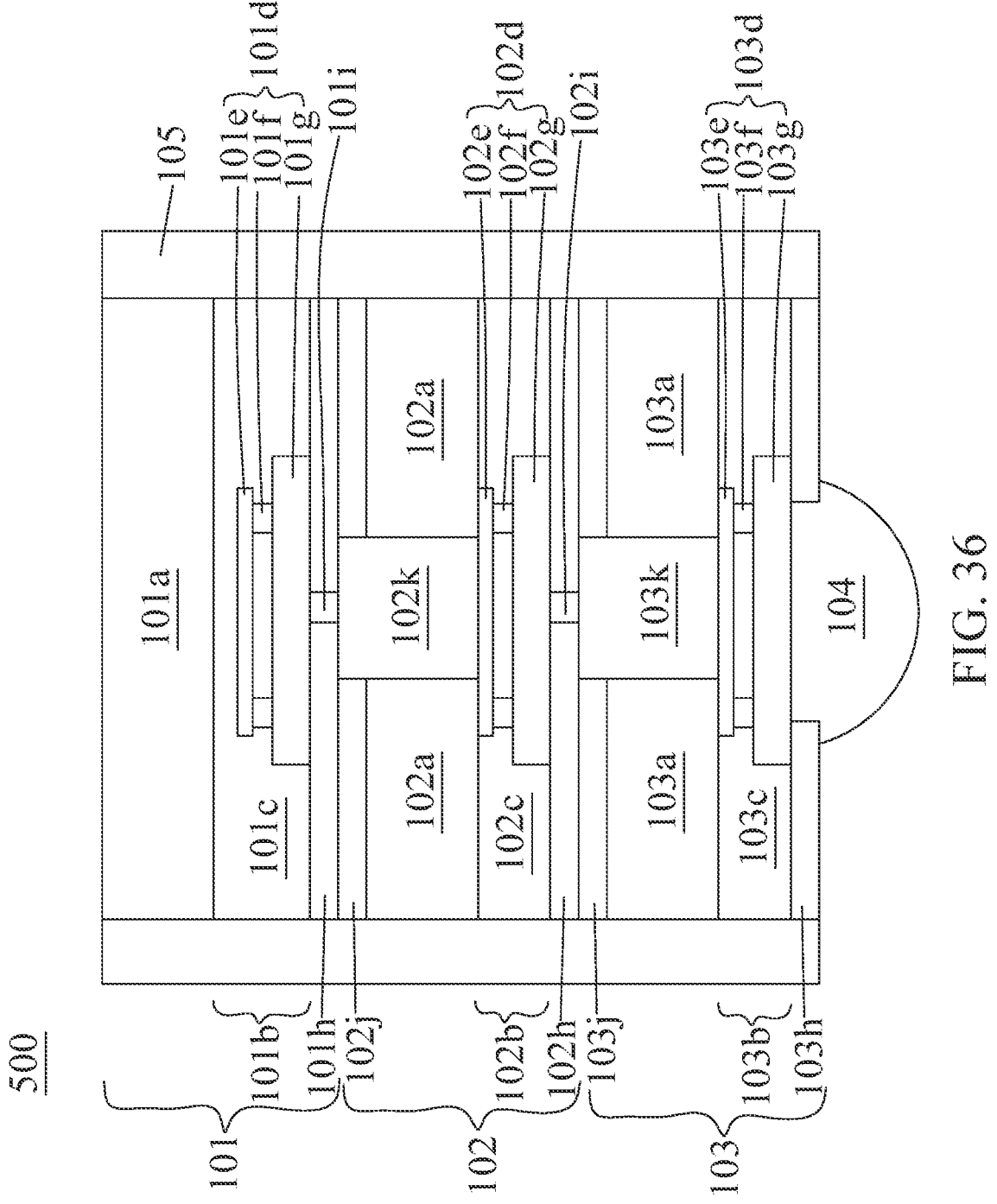

In some embodiments, after the disposing of the fifth bonding layer 103*h*, a portion of the fifth bonding layer 103*h* is removed to expose at least a portion of the third conductive pad 103g as shown in FIG. 34. In some embodiments, a conductive bump 104 is disposed on the third conductive pad 103g as shown in FIG. 34. In some embodiments, the second die 102 is bonded over the third die 103, and the first die 101 is bonded over the second die 102 as shown in FIG. 35. The first semiconductor structure 100 shown in FIG. 1 in flipped configuration is formed as shown in FIG. 35. In some embodiments, a molding 105 is formed to surround the first die 101, the second die 102 and the third die 103 as shown in FIG. 36. In some embodiments, a fifth semiconductor structure 500 shown in FIG. 5 is formed as shown in FIG. 36.

In conclusion, a first die is bonded to a second die by hybrid bonding, wherein the first die is electrically connected to the second die through a conductive pad in the first die, a through silicon via (TSV) in the second die, and a protrusion between the conductive pad and the TSV. Because the protrusion is substantially smaller than the conductive pad and the TSV, the protrusion can be formed by deposition rather than an electroplating process. Since the deposition can form the protrusion with a smaller grain size, the hybrid bonding between the first die and the second die can be annealed at a relatively lower temperature. Further, it should be realized that the relatively small protrusion will not significantly increase an electrical resistance between the conductive pad and the TSV. Therefore, formation of the protrusion between the conductive pad and the TSV is advantageous compared to a direct contact between the conductive pad and the TSV. As a result, the formation of the protrusion can improve an overall structure and reliability of the semiconductor structure.

One aspect of the present disclosure provides a semiconductor structure. The semiconductor structure includes a first die including a first substrate, a first dielectric layer over the first substrate, a first conductive pad at least partially exposed through the first dielectric layer, a first bonding layer over the first dielectric layer, and a first via extending through the first bonding layer and coupled to the first conductive pad; and a second die including a second bonding layer bonded to the first bonding layer, a second substrate over the second bonding layer, and a second via extending through the second substrate and the second bonding layer, wherein a first contact surface area between the first bonding layer and the second via is substantially greater than a second contact surface area between the first via and the second via.

Another aspect of the present disclosure provides a semiconductor structure. The semiconductor structure includes a first die including a first substrate, a first dielectric layer over the first substrate, a first conductive pad at least partially exposed through the first dielectric layer, a first bonding layer over the first dielectric layer, and a plurality of first vias extending through the first bonding layer and coupled to the first conductive pad; and a second die including a second bonding layer bonded to the first bonding layer, a second substrate over the second bonding layer, and a second via extending through the second substrate and the second bonding layer, wherein a first width of each of the plurality of first vias is substantially less than a second width of the second via.

Another aspect of the present disclosure provides a method of manufacturing a semiconductor structure. The method includes steps of forming a first die, forming a second die, and bonding the second die over the first die. The formation of the first die includes providing a first substrate and a first dielectric layer over the first substrate; forming a first conductive pad at least partially exposed through the first dielectric layer; disposing a first bonding layer over the first dielectric layer; removing a portion of the first bonding layer to form a first opening; and disposing a conductive material into the first opening to form a first via. The formation of the second die includes providing a second substrate, a second bonding layer over the second substrate, and a second via extending through the second substrate and partially through the second bonding layer; and removing a portion of the second bonding layer to expose the second via.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A semiconductor structure, comprising:
a first die including a first substrate, a first dielectric layer over the first substrate, a first conductive pad at least partially exposed through the first dielectric layer, a first bonding layer deposited over and contacted with top surfaces of the first dielectric layer and the first conductive pad, and a first via extending through the first bonding layer and coupled to the first conductive pad; and
a second die including a second bonding layer bonded to the first bonding layer, a second substrate over the second bonding layer, and a second via extending through the second substrate and the second bonding layer,
wherein a first contact surface between the first bonding layer and the second via is substantially greater than a second contact surface between the first via and the second via, wherein the first bonding area and the second via are in direct contact; wherein the first via and the second via are in direct contact.

2. The semiconductor structure of claim 1, wherein the first via is disposed between the second via and the first conductive pad.

3. The semiconductor structure of claim 1, wherein the second via is in contact with the first bonding layer.

4. The semiconductor structure of claim 1, wherein at least a portion of the first bonding layer is disposed between the first conductive pad and the second via.

5. The semiconductor structure of claim 1, wherein the second contact surface has a circular, quadrilateral or polygonal shape.

6. The semiconductor structure of claim 1, wherein a first width of the first via is substantially less than a second width of the second via.

7. The semiconductor structure of claim 6, wherein the first width of the first via is substantially less than 2 µm.

8. The semiconductor structure of claim 6, wherein the second width of the second via is about 5 µm.

9. The semiconductor structure of claim 6, wherein a width of the first conductive pad is substantially greater than the first width of the first via and the second width of the second via.

10. The semiconductor structure of claim 1, further comprising:

a first interconnect structure disposed within the first dielectric layer and under the first conductive pad;

a second dielectric layer disposed over the second substrate; and a second conductive pad disposed over the second via and at least partially exposed through the second dielectric layer.

11. The semiconductor structure of claim 10, wherein the second via is electrically connected to the second conductive pad through a second interconnect structure.

12. The semiconductor structure of claim 10, wherein the first interconnect structure is coupled to the first conductive pad and is electrically connected to the first via.

* * * * *